(12) United States Patent
Yun et al.

(10) Patent No.: US 8,674,429 B2
(45) Date of Patent: Mar. 18, 2014

(54) GATE STRUCTURE IN NON-VOLATILE MEMORY DEVICE

(71) Applicants: Jang-Gn Yun, Hwaseong-si (KR);
Jung-Dal Choi, Hwaseong-si (KR);
Kwang-Soo Seol, Yongin-si (KR)

(72) Inventors: Jang-Gn Yun, Hwaseong-si (KR);
Jung-Dal Choi, Hwaseong-si (KR);
Kwang-Soo Seol, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/759,195

(22) Filed: Feb. 5, 2013

(65) Prior Publication Data

US 2013/0270624 A1 Oct. 17, 2013

(30) Foreign Application Priority Data

Apr. 17, 2012 (KR) ........................ 10-2012-0039915

(51) Int. Cl.
*H01L 21/02* (2006.01)

(52) U.S. Cl.
USPC .... 257/324; 257/321; 257/406; 257/E21.409; 257/E21.423; 257/E29.292

(58) Field of Classification Search
USPC .......... 257/321–327, 406–411, E21.409, 423, 257/29.292, 309, 345
See application file for complete search history.

(56) References Cited

U.S. PATENT DOCUMENTS

| | | | |
|---|---|---|---|
| 5,177,570 A | 1/1993 | Tanaka | |
| 7,564,094 B2 * | 7/2009 | Kim et al. | 257/324 |
| 8,530,954 B2 * | 9/2013 | Kim et al. | 257/324 |
| 2008/0150008 A1 * | 6/2008 | Kim et al. | 257/324 |
| 2009/0020831 A1 * | 1/2009 | Ramkumar et al. | 257/406 |
| 2009/0045452 A1 * | 2/2009 | Lue et al. | 257/321 |
| 2009/0239368 A1 * | 9/2009 | Park et al. | 438/592 |
| 2009/0261405 A1 * | 10/2009 | Kim et al. | 257/324 |
| 2009/0309161 A1 | 12/2009 | Chang | |
| 2010/0001353 A1 * | 1/2010 | Mieno | 257/411 |
| 2011/0068416 A1 | 3/2011 | Son | |
| 2013/0178031 A1 * | 7/2013 | Ramkumar et al. | 438/287 |

FOREIGN PATENT DOCUMENTS

| | | |
|---|---|---|
| KR | 2004-0057569 A | 7/2004 |
| KR | 2005-0028463 A | 3/2005 |
| KR | 2005-0064314 A | 6/2005 |
| KR | 2005-0086293 A | 8/2005 |
| KR | 2010-0004556 A | 1/2010 |
| KR | 2011-0031575 A | 3/2011 |

* cited by examiner

*Primary Examiner* — Michael Lebentritt
(74) *Attorney, Agent, or Firm* — Harness, Dickey & Pierce, P.L.C.

(57) ABSTRACT

A gate structure of a non-volatile memory device and a method of forming the same including a tunnel oxide layer pattern, a charge trap layer pattern, a blocking dielectric layer pattern having the uppermost layer including a material having a first dielectric constant greater than that of a material included in the tunnel oxide layer pattern, and first and second conductive layer patterns. The gate structure includes a first spacer to cover at least the sidewall of the second conductive layer pattern. The gate structure includes a second spacer covering the sidewall of the first spacer and the sidewall of the first conductive layer pattern and including a material having a second dielectric constant equal to or greater than the first dielectric constant. In the non-volatile memory device including the gate structure, erase saturation caused by back tunneling is reduced.

20 Claims, 31 Drawing Sheets

GATE STRUCTURE IN NON-VOLATILE MEMORY DEVICE

CROSS-REFERENCE TO RELATED APPLICATION

This application claims priority under 35 USC §119 to Korean Patent Application No. 10-2012-0039915 filed on Apr. 17, 2012 in the Korean Intellectual Property Office (KIPO), the entire disclosure of which is incorporated herein by reference.

BACKGROUND

1. Field

Example embodiments relate to a gate structure provided in a non-volatile memory device. More particularly, example embodiments relate to a gate structure provided in a charge-trap NAND flash memory device.

2. Description of the Related Art

In a charge-trap NAND flash memory device, data is recorded by storing charges in a charge trap layer pattern serving as an insulator or erasing charges from the charge trap layer pattern. Since the charge-trap NAND flash memory device can be easily scaled down while representing superior endurance capability and characteristic uniformity, the charge-trap NAND flash memory device has been studied and researched for use as a next generation memory.

SUMMARY

Example embodiments provide a gate structure provided in a non-volatile memory device capable of preventing an erase saturation caused by back tunneling.

Example embodiments provide a method of forming the gate structure.

According to example embodiments, there is provided a gate structure. The gate structure includes a tunnel oxide layer pattern and a charge trap layer pattern sequentially stacked on a substrate. A blocking dielectric layer pattern is formed on the charge trap layer pattern having an uppermost layer including a material having a first dielectric constant that is greater than that of a material included in the tunnel oxide layer pattern. First and second conductive layer patterns are sequentially stacked on the blocking dielectric layer pattern. A first spacer covers at least a sidewall of the second conductive layer pattern, and a second spacer covers sidewalls of the first spacer and the first conductive layer pattern and includes a material having a second dielectric constant, the second dielectric constant equal to or greater than the first dielectric constant.

In the example embodiments, a first material including the first conductive layer pattern may be different from a second material constituting the second conductive layer pattern.

In the example embodiments, the first conductive layer pattern may have a first work function and the second conductive layer pattern may have a second work function that is less than the first work function.

In the example embodiments, the sidewall of the first conductive layer pattern may include a lower portion and an upper portion, the lower portion may have a first width, and an upper portion may have a second width narrower than the first width.

In the example embodiments, a bottom surface of the first spacer may be spaced apart from and above a top surface of the blocking dielectric layer pattern by a thin film.

In the example embodiments, a bottom surface of the second spacer may be closer to the substrate than a bottom surface of the first spacer.

In the example embodiments, the uppermost layer of the blocking dielectric layer pattern may include any one of materials selected from the group consisting of aluminum oxide ($Al_2O_3$), hafnium oxide ($HfO_2$), lanthanum oxide ($La_2O_3$), lanthanum aluminum oxide ($LaAlO_3$), lanthanum hafnium oxide (LaHfO), hafnium aluminum oxide (HfAlO), titanium oxide ($TiO_2$), tantalum oxide ($Ta_2O_5$), and zirconium oxide ($ZrO_2$).

In the example embodiments, the first spacer may cover the sidewall of the second conductive layer pattern and an upper portion of the sidewall of the first conductive layer pattern.

In the example embodiments, the gate structure may further include a buffer conductive layer pattern between the first and second conductive layer patterns.

In the example embodiments, the buffer conductive layer pattern may include a polysilicon material.

In the example embodiments, the first spacer may cover the sidewall of the second conductive layer pattern and a portion of a sidewall of the buffer conductive layer pattern.

In the example embodiments, the second spacer has an upper portion and a lower portion, the lower portion being a portion of the second spacer that makes contact with the first conductive layer pattern, the lower portion having a width wider than a width of the upper portion.

According to example embodiments, there is provided a gate structure. The gate structure includes a tunnel oxide layer pattern and a charge trap layer pattern sequentially stacked on a substrate. A blocking dielectric layer pattern is formed on the charge trap layer pattern and includes at least one dielectric layer. A barrier metallic layer pattern is stacked on the blocking dielectric layer pattern. A metallic layer pattern is formed on the barrier metallic layer pattern. A first spacer covers a sidewall of the metallic layer pattern and an upper sidewall of the barrier metallic layer pattern. A second spacer covers a sidewall of the first spacer and a lower sidewall of the barrier metallic layer pattern and including a material having a first dielectric constant equal to or greater than a second dielectric constant of an uppermost dielectric layer of the blocking dielectric layer pattern.

In the example embodiments, a bottom surface of the second spacer may directly contact a top surface of the blocking dielectric layer pattern.

In the example embodiments, the first spacer may include an insulating material configured to prevent the sidewall of the metallic layer pattern from being oxidized.

According to example embodiments, there is provided a gate structure.

In one example embodiment, the gate structure includes a substrate, a blocking dielectric layer, a first conductive layer pattern, a second conductive layer pattern, a first spacer, and a second spacer. The substrate having sequentially formed thereon a tunnel oxide layer pattern and a charge trap layer pattern, the charge trap layer pattern configured to trap charges therein and the tunnel oxide layer pattern including a material having a first dielectric constant. The blocking dielectric layer formed on the charge trap layer pattern, the blocking dielectric layer having a top surface that includes an inner portion and an outer portion, the inner portion of the top surface including a material having a second dielectric constant, the second dielectric constant being greater than the first dielectric constant. The first conductive layer pattern formed on the inner portion of the blocking dielectric layer, the first conductive layer pattern having sidewalls. The second conductive layer pattern formed on the first conductive layer pattern, the second conductive layer pattern including a metallic material having a resistance lower than that of a material included in the first conductive layer pattern. The first spacer including a material having a third dielectric constant, the first spacer enclosing the second conductive layer to prevent oxidation thereof. The second spacer formed on the outer portion of the blocking dielectric layer such that the spacer covers the sidewalls of the first conductive layer pattern, the second spacer having a third dielectric constant, the third dielectric constant being greater than or equal to the first dielectric constant and greater than the second dielectric constant.

In one example embodiment, the first conductive layer pattern has a top surface that includes an inner conductive portion and an outer conductive portion, the inner conductive portion being in contact with the second conductive layer pattern and the outer conductive portion being in contact with a bottom surface of the first spacer.

In one example embodiment, a bottom surface of the second spacer is closer to the substrate than the bottom surface of the first spacer.

In one example embodiment, the bottom surface of the second spacer is wider than a top surface of the second spacer.

In one example embodiment, the gate structure further includes a buffer conductive layer pattern formed between the first conductive layer pattern and the second conductive layer pattern, the buffer conductive layer having a top surface that includes an inner buffer portion and an outer buffer portion. The inner buffer portion is in contact with the second conductive layer pattern and the outer conductive portion is in contact with a bottom surface of the first spacer, and the buffer conductive layer pattern has a thickness that is greater than a thickness of the first conductive layer pattern.

According to example embodiments, there is provided a method of forming a gate structure. A tunnel oxide layer and a charge trap layer are sequentially formed on a substrate. A blocking dielectric layer including the uppermost layer including a high dielectric material is formed on the charge trap layer. First and second conductive layer are formed on the blocking dielectric layer. A second conductive layer pattern is formed by patterning the second conductive layer. A first spacer is formed on the sidewall of the second conductive layer pattern. A first conductive layer pattern is formed by patterning the first conductive layer. A second spacer is formed to cover the sidewall of the first spacer and the sidewall of the first conductive layer pattern. The second spacer has a first dielectric constant equal to or greater than a second of the uppermost layer of the blocking dielectric layer. In addition, a tunnel oxide layer pattern, a charge trap layer pattern, and a blocking dielectric layer pattern are formed by patterning the tunnel oxide layer, the charge trap layer, and the blocking dielectric layer.

In example embodiments, a preliminary first conductive layer pattern may be formed by etching a portion of the first conductive layer during the process of patterning the second conductive layer.

In example embodiments, the first conductive layer may be patterned through an isotropic etching process so that the sidewall of the first conductive layer pattern is formed inward from the sidewall of the first spacer.

In example embodiments, after forming the first conductive layer pattern, a process of isotropic-etching the sidewall of the first conductive layer pattern by a predetermined thickness may be additionally performed.

According to example embodiments, a buffer conductive layer is formed between the first and second conductive layers. The buffer conductive layer pattern is formed by patterning the buffer conductive layer.

In example embodiments, during the process of patterning the second conductive layer, a preliminary buffer conductive layer pattern may be formed by etching a portion of the buffer conductive layer.

In example embodiments, the first spacer may cover the sidewall of the second conductive layer pattern and a portion of the sidewall of the buffer conductive layer pattern.

In example embodiments, the material including the uppermost layer of the blocking dielectric layer pattern may include any one selected from the group consisting of aluminum oxide ($Al_2O_3$), hafnium oxide ($HfO_2$), lanthanum oxide ($La_2O_3$), lanthanum aluminum oxide ($LaAlO_3$), lanthanum hafnium oxide (LaHfO), hafnium aluminum oxide (HfAlO), titanium oxide ($TiO_2$), tantalum oxide ($Ta_2O_5$), and zirconium oxide ($ZrO_2$).

According to example embodiments, the non-volatile memory device employing the gate structure prevents an erase saturation caused by back tunneling. Therefore, a non-volatile memory device having high performance can be provided.

BRIEF DESCRIPTION OF THE DRAWINGS

Example embodiments will be more clearly understood from the following detailed description taken in conjunction with the accompanying drawings. FIGS. 1a to 19 represent non-limiting, example embodiments as described herein.

FIG. 1A is a cross-sectional view illustrating a gate structure provided in a non-volatile memory device according to a first example embodiment;

FIG. 3 is a cross-sectional view illustrating a gate structure provided in a non-volatile memory device according to a second example embodiment;

FIG. 5 is a cross-sectional view illustrating a gate structure provided in a non-volatile memory device according to a third example embodiment;

FIG. 7 is a cross-sectional view illustrating a non-volatile memory device according to one example embodiment;

FIG. 10 is a cross-sectional view illustrating a vertical type non-volatile memory device according to another example embodiment;

FIG. 19 is a block diagram illustrating a memory system provided with the non-volatile memory device according to example embodiments.

DETAILED DESCRIPTION OF THE EMBODIMENTS

Figure 1A:
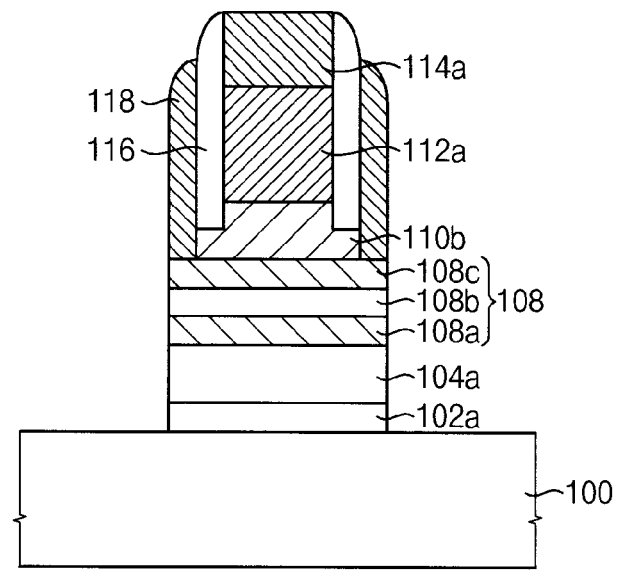

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly The technology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which these inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Embodiment 1

Figure 1B:
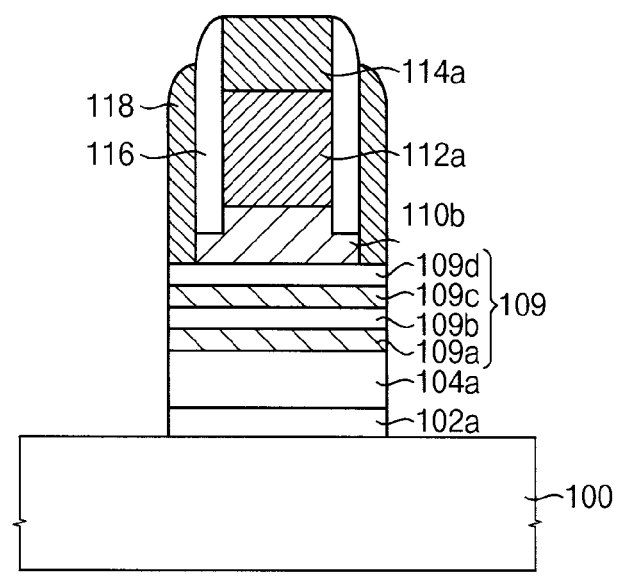
FIGS. 1B and 1C are cross-sectional views illustrating a gate structure provided in a non-volatile memory device according to modified example embodiments.
Figure 1C:
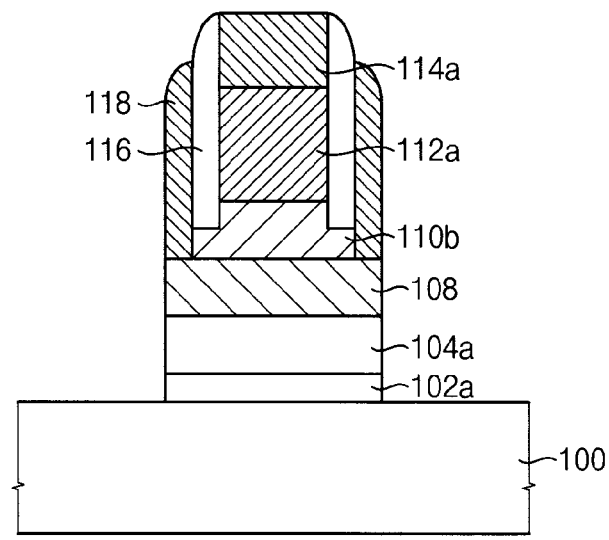

FIG. 1A is a cross-sectional view illustrating a gate structure provided in a non-volatile memory device according to a first example embodiment, and FIGS. 1B and 1C are cross-sectional views illustrating a gate structure provided in a non-volatile memory device according to modified example embodiments.

Referring to FIG. 1A, a gate structure includes a tunnel oxide layer pattern 102a, a charge trap layer pattern 104a, a blocking dielectric layer pattern 108, first and second conductive layer patterns 110b and 112a, respectively, and a hard mask pattern 114a which are sequentially stacked on a semiconductor substrate 100. In addition, the gate structure includes first and second spacers 116 and 118, respectively, formed on a sidewall of the stacked structure.

The semiconductor substrate 100 may include a silicon substrate, a germanium substrate, a silicon-germanium substrate, a silicon-on-insulator (SOI) substrate, or a germanium-on-insulator (GOI) substrate. Although not illustrated in drawings, the semiconductor substrate 100 may further include a well having P-type impurities or N-type impurities.

The tunnel oxide layer pattern 102a may include silicon oxide.

The charge trap layer pattern 104a may include a material to trap charges. For example, according to one example embodiment, the charge trap layer pattern 104a may include silicon nitride.

The blocking dielectric layer pattern 108 may include a high dielectric layer having a high dielectric constant. The high dielectric layer may include a material having a dielectric constant greater than that of silicon oxide. Since the dielectric constant of silicon oxide formed through a thermal oxidation process is about 3.9, the high dielectric layer may include a material having the dielectric constant of at least 3.9. Examples of materials used for the high dielectric layer may include aluminum oxide ($Al_2O_3$), hafnium oxide ($HfO_2$), lanthanum oxide ($La_2O_3$), lanthanum aluminum oxide ($LaAlO_3$), lanthanum hafnium oxide (LaHfO), hafnium aluminum oxide (HfAlO), titanium oxide ($TiO_2$), tantalum oxide ($Ta_2O_5$), zirconium oxide ($ZrO_2$), etc. The above materials may be used alone or in a combination thereof.

The blocking dielectric layer pattern 108 may include only a high dielectric layer. Alternately, the blocking dielectric layer pattern 108 may have a multi-layer structure including various oxides, nitrides, or oxynitrides in addition to the high dielectric layer. In this case, the uppermost part of the blocking dielectric layer pattern 108 may be provided as the high dielectric layer.

In some example embodiments, as illustrated in FIG. 1A, the blocking dielectric layer pattern 108 may have a structure in which a first high dielectric layer 108a, a silicon oxide layer 108b, and a second high dielectric layer 108c are stacked on each other.

In some modified example embodiments, as illustrated in FIG. 1B, the blocking dielectric layer pattern 108 may have a structure in which a first silicon oxide layer 109a, a first high dielectric layer 109b, a second silicon oxide layer 109c, and a second high dielectric layer 109d are stacked on each other.

In other modified example embodiments, as illustrated in FIG. 1C, the blocking dielectric layer pattern 108 may include only the first high dielectric layer.

The first and second conductive layer patterns 110b and 112a formed on the blocking dielectric layer pattern 108 may serve as a control gate electrode.

The first and second conductive layer patterns 110b and 112a may include a metallic material. In some example embodiments, the first conductive layer pattern 110b may include a barrier metallic layer, and the second conductive layer pattern 112a may include metal. In other words, the second conductive layer pattern 112a has resistance lower than that of the first conductive layer pattern 110b, and actually serves as a wiring line. Accordingly, as illustrated in FIG. 1a, the second conductive layer pattern 112a is thicker than the first conductive layer pattern 110b. Examples of materials used for the first conductive layer pattern 110b may include titanium (Ti), titanium nitride (TiN), tantalum (Ta), or tantalum nitride ($Ta_2N$). The above materials may be used alone or in a combination thereof. For example, the second conductive layer pattern 112a may include tungsten (W).

Meanwhile, since the high dielectric layer is formed at the uppermost part of the blocking dielectric layer pattern 108, when polysilicon makes direct contact with an upper portion of the high dielectric layer, a Fermi level pinning may undesirably occur. Therefore, the use of polysilicon for the first conductive layer pattern 110b is undesirable because of direct contact with the blocking dielectric layer pattern 108.

In addition, the threshold voltage characteristic of a cell transistor may be varied according to a first work function of the first conductive layer pattern 110b that direct contacts with the blocking dielectric layer pattern 108. Preferably, the first work function may be greater than 4.0 eV. In addition, the first work function may be greater than a second work function of the second conductive layer pattern 112a.

A sidewall of the first conductive layer pattern 110b does not have a continuous flat surface, but laterally protrudes at the lower portion thereof. Therefore, the lower portion of the first conductive layer pattern 110b has a first width, and the upper portion of the first conductive layer pattern 110b has a second width narrower than the first width. The protrusion part of the first conductive layer pattern 110b may have a flat top surface.

The second conductive layer pattern 112a has a flat surface continuously extending from an upper sidewall of the first conductive layer pattern 110b. For example, the second conductive layer pattern 112a may have the second width such that the width of the second conductive layer pattern 112a is equal to the width of the upper portion of the first conductive layer pattern 110b.

The hard mask pattern 114a may include silicon nitride.

The first spacer 116 is formed on a top surface of the protrusion part of the first conductive layer pattern 110b while being formed on both of a sidewall of the second conductive layer pattern 112a and a sidewall of the upper portion of the first conductive layer pattern 110b. The first spacer 116 may have a width equal to that of the protrusion part of the first conductive layer pattern 110b. Therefore, the first spacer 116 is spaced apart from a top surface of the blocking dielectric layer pattern 108 while being provided higher relative to the substrate 100 than the top surface of the blocking dielectric layer pattern 108. Therefore, the first spacer 116 does not make direct contact with the blocking dielectric layer pattern 108. The first spacer 116 prevents the sidewalls of the first and second conductive layer patterns 110b and 112a, which includes a metallic material, from being oxidized. Accordingly, the first spacer 116 may include silicon nitride.

The second spacer 118 makes contact with both of a sidewall of the first spacer 116 and the sidewall of the protrusion part of the first conductive layer pattern 110b. In addition, a bottom surface of the second spacer 118 makes direct contact with a thin film formed at the uppermost part of the blocking dielectric layer pattern 108. The bottom surface of the second spacer 118 is positioned lower than a bottom surface of the first spacer 116. The second spacer 118 has a first dielectric constant equal to or greater than a second dielectric constant of the thin film positioned at the uppermost part of the blocking dielectric layer pattern 108. In addition, the second spacer 118 includes a material different from that of the first spacer 116, and has the first dielectric constant greater than a that of the first spacer 116. In other words, the second spacer 118 has the first dielectric constant equal to or greater than that of the second high dielectric layer. Example of materials used for the second spacer 118 may include aluminum oxide ($Al_2O_3$), hafnium oxide ($HfO_2$), lanthanum oxide ($La_2O_3$), lanthanum aluminum oxide ($LaAlO_3$), lanthanum hafnium oxide (LaHfO), hafnium aluminum oxide (HfAlO), titanium oxide (TiO$_2$), tantalum oxide (Ta$_2$O$_5$), zirconium oxide (ZrO$_2$), etc. The above materials can be used alone or in a combination thereof. The second spacer 118 may selectively include materials having the first dielectric constant equal to or greater than that of a material constituting the second high dielectric layer. As described above, a bottom surface and a lateral side of the first conductive layer pattern 110b are surrounded by a dielectric layer having a high dielectric constant.

In the non-volatile memory device, data is recorded by storing charges into the charge trap layer pattern 104a of the gate structure or erasing charges from the charge trap layer pattern 104a.

In the erasing operation, electrons trapped in the charge trap layer pattern 104a are drawn out through the tunnel oxide layer pattern 102a and erased by applying erase voltage to the second conductive layer pattern 112a serving as a control gate. In the erasing operation, when high negative voltage is applied to the second conductive layer pattern 112a, charges may be drawn out from the charge trap layer pattern 104a through the tunnel oxide layer pattern 102a, but electrons existing in the second conductive layer pattern 112a may be back-tunneled through the blocking dielectric layer and introduced into the charge trap layer pattern 104a. As described above, in example embodiments, in the erasing operation charges are not introduced into the charge trap layer pattern 104a through the back tunneling, which is called an erase saturation.

In order to prevent charges from being introduced into the charge trap layer pattern 104a through the back tunneling, the blocking dielectric layer pattern 108 that directly contacts the first conductive layer pattern 110b preferably includes a material having the high dielectric constant, so that a high tunnel barrier is formed. In addition, preferably, an electric field is uniformly generated between the first conductive layer pattern 110b and the blocking dielectric layer pattern 108, so that the electric field is prevented from being concentrated on a particular region.

In the present example embodiment, the bottom surface and the lateral side of the first conductive layer pattern 110b are surrounded by a dielectric layer having a high dielectric constant. In particular, the second spacer 118 including a material having a high dielectric constant is formed on the sidewall of the first conductive layer pattern 110b, thereby uniformly generating an electric field at an edge region of the first conductive layer pattern 110b, so that the electric field is not concentrated on the edge region of the first conductive layer pattern 110b. Accordingly, the back tunneling caused by the concentration of the electric field on the edge region of the first conductive layer pattern 110b may be reduced, so that the non-volatile memory device represent an improved erasing operation characteristic.

FIGS. 2A to 2E are cross-sectional views illustrating a method of forming the gate structure of FIG. 1a.

Figure 2A:
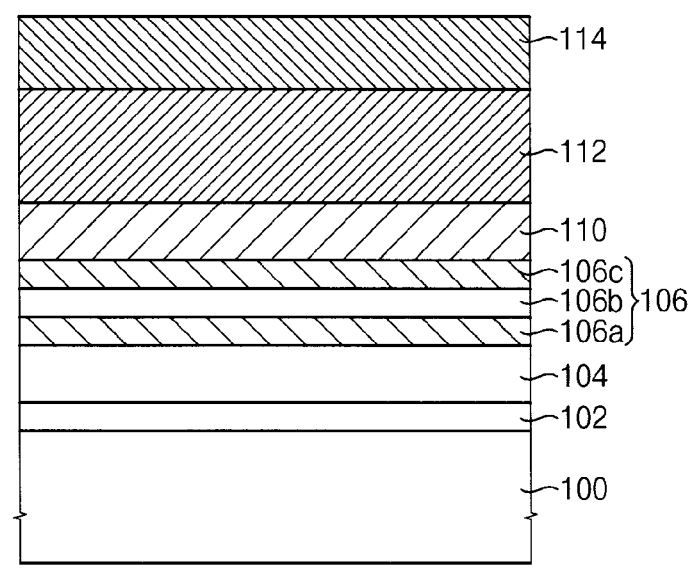
FIGS. 2A to 2E are cross-sectional views illustrating a method of forming the gate structure of FIG. 1A.

Referring to FIG. 2A, a tunnel oxide layer 102, a charge trap layer 104, and a blocking dielectric layer 106 are sequentially formed on a semiconductor substrate 100.

The tunnel oxide layer 102 may include silicon oxide, and may be formed through a thermal oxidation process. According to another example embodiment, the tunnel oxide layer 102 may be formed by performing a chemical vapor deposition (CVD) process, an atomic layer deposition (ALD) process, or a sputtering process.

The charge trap layer 104 may include silicon nitride and may be formed by performing a CVD process, an ALD process, or a sputtering process.

The blocking dielectric layer 106 may have a stacked structure including a high dielectric layer at the uppermost part thereof. For example, as illustrated in FIG. 2A, the blocking dielectric layer 106 may be formed by sequentially depositing a first high dielectric layer 106a, a silicon oxide layer 106b, and a second high dielectric layer 106c.

The first high dielectric layer 106a may be formed by performing a CVD process, an ALD process, or a sputtering process. The first high dielectric layer 106a may include a high dielectric material. Example of the high dielectric materials used for the first high dielectric layer 106a may include aluminum oxide (Al$_2$O$_3$), hafnium oxide (HfO$_2$), lanthanum oxide (La$_2$O$_3$), lanthanum aluminum oxide (LaAlO$_3$), lanthanum hafnium oxide (LaHfO), hafnium aluminum oxide (HfAlO), titanium oxide (TiO$_2$), tantalum oxide (Ta$_2$O$_5$), zirconium oxide (ZrO$_2$), etc. The high dielectric materials can be used alone or in a combination thereof.

The silicon oxide layer 106b may be formed by performing a CVD process, an ALD process, or a sputtering process.

The second high dielectric layer 106c may be formed by performing a CVD process, an ALD process, or a sputtering process. The second high dielectric layer 106c may include a high dielectric material. Example of the high dielectric materials used for the second high dielectric layer 106c may include such as silicon nitride using aluminum oxide (Al$_2$O$_3$), hafnium oxide (HfO$_2$), lanthanum oxide (La$_2$O$_3$), lanthanum aluminum oxide (LaAlO$_3$), lanthanum hafnium oxide (LaHfO), hafnium aluminum oxide (HfAlO), titanium oxide (TiO$_2$), tantalum oxide (Ta$_2$O$_5$), zirconium oxide (ZrO$_2$), etc. The high dielectric materials can be used alone or in a combination thereof. In some example embodiments, a material used for the second high dielectric layer 106c may be same or different material then used for the first high dielectric layer 106a.

Although the present example embodiment is described in that the blocking dielectric layer 106 is formed by depositing the first high dielectric layer 106a, the silicon oxide layer 106b, and the second high dielectric layer 106c, the blocking dielectric layer 106 may have various stacked structures. For example, in some example embodiments, the blocking dielectric layer 106 may be formed by sequentially depositing a first silicon oxide layer, a first high dielectric layer, a second silicon oxide layer, and a second high dielectric layer while in some example embodiments, the blocking dielectric layer 106 may include only a high dielectric layer.

Thereafter, a first conductive layer 110, a second conductive layer 112, and a hard mask layer 114 are formed on the blocking dielectric layer 106.

The first conductive layer 110 may be formed by depositing metallic materials. Examples of the metallic materials used for the first conductive layer 110 may include titanium (Ti), titanium nitride (TiN), tantalum (Ta), tantalum nitride (Ta$_2$N), etc. The above metallic materials may be used alone or in a stacked form including at least two materials. The first conductive layer 110 serves as a barrier metallic layer.

The second conductive layer 112 may include tungsten (W). The second conductive layer 112 is thicker than the first conductive layer 110.

The hard mask layer 114 may be formed by depositing silicon nitride.

Figure 2B:
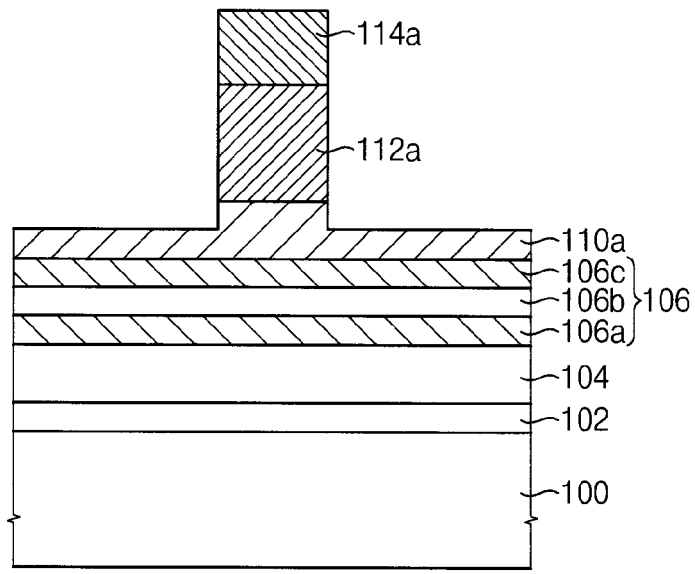

Referring to FIG. 2B, the hard mask pattern 114a is formed by patterning the hard mask layer 114 using a photoresist pattern.

The second conductive layer 112 is etched by using the hard mask pattern 114a so that a top surface of the first conductive layer 110 is exposed. Subsequently, a portion of the first conductive layer 110 provided under the second conductive layer 112 is etched. The second and first conductive layers 110 and 112 may be etched through an anisotropic etching process. In example embodiments, only the second conductive layer 112 need be etched through the anisotropic etching process. However, when the etching process is actually performed, an over etching process must be performed in order to etch the entire exposed portion of the second conductive layer 112. In this case, the exposed top surface of the first conductive layer 110 may be partially etched to form a preliminary first conductive layer pattern 110a.

After the above etching process has been performed, a second conductive layer pattern 112a and the preliminary first conductive layer pattern 110a are formed.

Figure 2C:
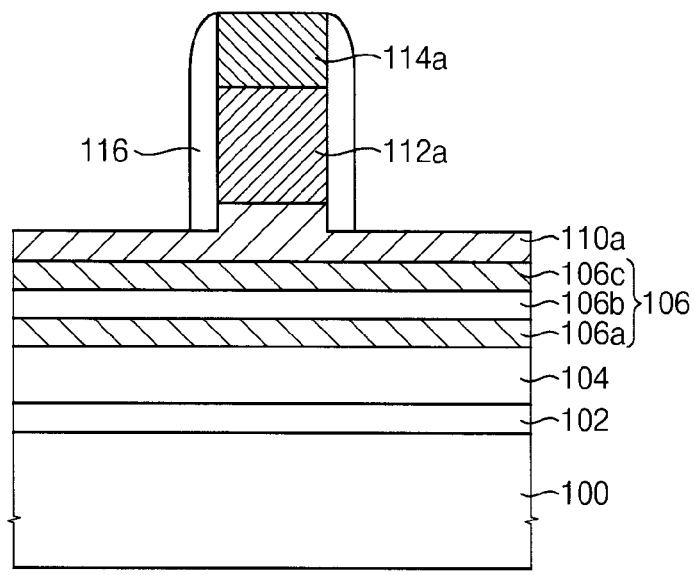

Referring to FIG. 2C, the first spacer 116 is formed from a first spacer layer (not illustrated). The first spacer layer is formed on the surfaces of the second conductive layer pattern 112a, the preliminary first conductive layer pattern 110a, and the hard mask pattern 114a. The first spacer layer is formed to prevent the sidewall of the second conductive layer pattern 112a from being oxidized. The first spacer layer may be formed by depositing silicon nitride.

The first spacer 116 is formed by anisotropic-etching the first spacer layer. The first spacer 116 is formed on the sidewall of the second conductive layer pattern 112a and the sidewall of the preliminary first conductive layer pattern 110a.

Figure 2D:
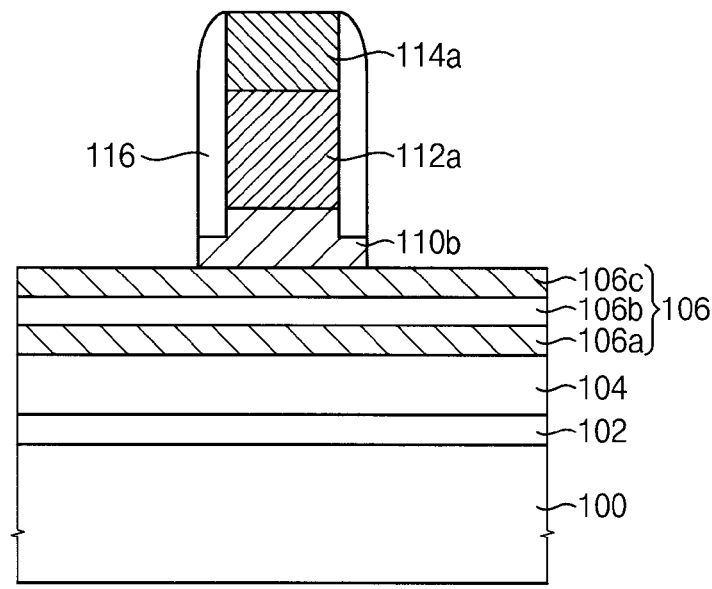

Referring to FIG. 2D, the first conductive layer pattern 110b is formed by anisotropic-etching the preliminary first conductive layer pattern 110a using both of the first spacer 116 and the hard mask pattern 114a as an etching mask. In the above etching process, a portion or the entire portion of the second high dielectric layer 106c, which is exposed under the preliminary first conductive layer pattern 110a, may be etched.

The lower portion of the first conductive layer pattern 110b protrudes in a lateral direction. The first conductive layer pattern 110b is formed on the sidewall thereof with the first spacer 116. The lower portion of the first conductive layer pattern 110b has the first width and the upper portion of the first conductive layer pattern 110b has the second width narrower than the first width.

Figure 2E:
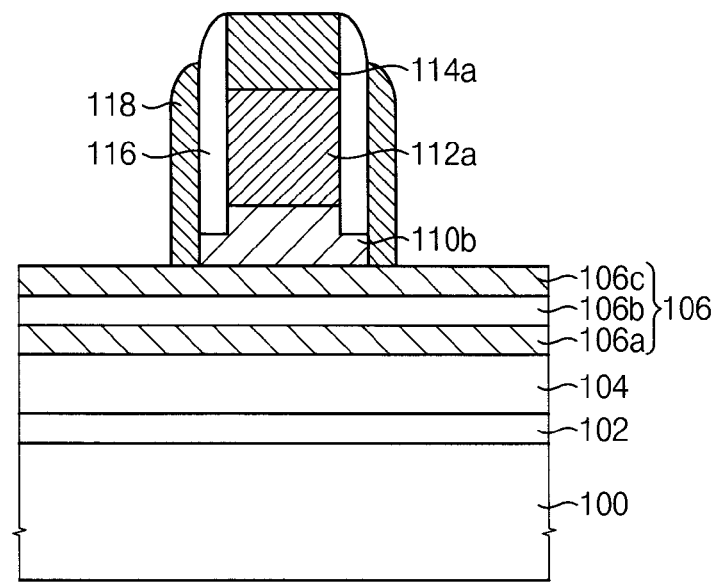

Referring to FIG. 2E, the second spacer 1180 is formed from a second spacer layer (not illustrated). The second spacer layer is formed on the surface of the first spacer 116, the second high dielectric layer 106c, and the hard mask pattern 114a. The second spacer layer has a first dielectric constant equal to or greater than a second dielectric constant of the second high dielectric layer 106c formed at the uppermost part of the blocking dielectric layer 106. Example of materials used for the second spacer layer may include aluminum oxide ($Al_2O_3$), hafnium oxide ($HfO_2$), lanthanum oxide ($La_2O_3$), lanthanum aluminum oxide ($LaAlO_3$), lanthanum hafnium oxide (LaHfO), hafnium aluminum oxide (HfAlO), titanium oxide ($TiO_2$), tantalum oxide ($Ta_2O_5$), zirconium oxide ($ZrO_2$), etc. The above materials may be used alone or in a combination thereof The second spacer layer may selectively include a material having the first dielectric constant equal to or greater than the second dielectric constant among the above materials.

Thereafter, the second spacer 118 is formed on both of the sidewall of the first spacer 116 and the sidewall of the protrusion part of the first conductive layer pattern 110b by anisotropic-etching the second spacer layer.

Subsequently, as illustrated in FIG. 1A, the second high dielectric layer 106c, the silicon oxide layer 106b, the first high dielectric layer 106a, the charge trap layer 104, and the tunnel oxide layer 102, which are provided under the second spacer 118 and the hard mask pattern 114a, are etched by using both of the second spacer 118 and the hard mask pattern 114a as an etching mask. Accordingly, the tunnel oxide layer pattern 102a, the charge trap layer pattern 104a, and the blocking dielectric layer pattern 108 are formed.

The gate structure is formed by performing the above processes.

Thereafter, although not illustrated in drawings, an impurity region is formed at the upper portion of the semiconductor substrate 100, which is adjacent to the gate structure, by an ion implantation process using the gate structure as an ion implantation mask. Through the above processes, a cell transistor of the non-volatile memory device may be manufactured.

Embodiment 2

Figure 3:
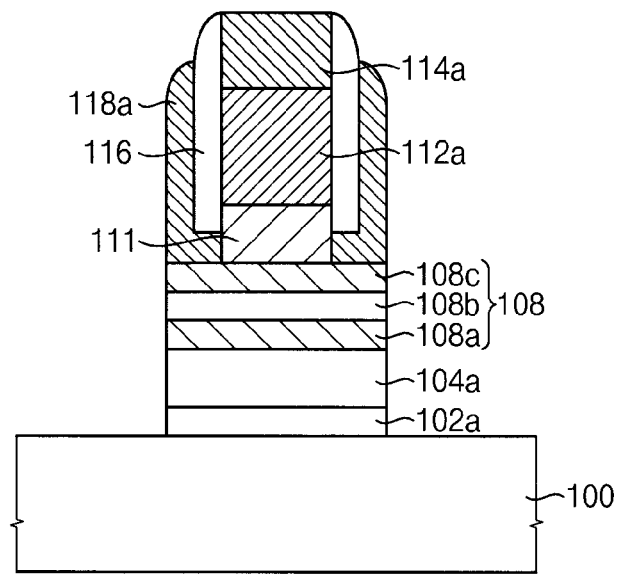

FIG. 3 is a cross-sectional view illustrating a gate structure provided in a non-volatile memory device according to a second example embodiment.

The gate structure according to the present example embodiment has the same as the gate structure according to the first example embodiment except the present example embodiment does not have the first conductive layer pattern 110b and the second spacer 118. Instead, the present example embodiment includes a first conductive layer pattern 111 and a second spacer 118a that have shapes that differ from the first conductive layer pattern 110b and the second spacer 118, respectively.

Referring to FIG. 3, similarly to the gate structure described in the first example embodiment, the gate structure according to the present example embodiment includes the tunnel oxide layer pattern 102a, the charge trap layer pattern 104a, the blocking dielectric layer pattern 108, first and second conductive layer patterns 111 and 112a, and the hard mask pattern 114a which are sequentially stacked on the semiconductor substrate 100. In addition, the gate structure includes first and second spacers 116 and 118a formed on a sidewall of the stacked structure.

The tunnel oxide layer pattern 102a, the charge trap layer pattern 104a, and the blocking dielectric layer pattern 108, which are formed on the semiconductor substrate 100, have the same structures as those according to the first example embodiment.

The first and second conductive layer patterns 111 and 112a formed on the blocking dielectric layer pattern 108 serve as a control gate electrode. The materials constituting the first and second conductive layer patterns 111 and 112a are the same as the materials constituting the first and second conductive layer patterns 110b and 112a described according to the first example embodiment.

The first spacer 116 is positioned on both of the entire sidewall of the second conductive layer pattern 112a and the upper portion of sidewall of the first conductive layer pattern 111. The materials constituting the first spacer 116 are the same as the materials constituting the first spacer 116 described according to the first example embodiment.

The sidewall of the first conductive layer pattern 111 may discontinuously aligned with respect to the sidewall of the first spacer 116, and may be formed inward from the sidewall of the first spacer 116. In other words, the first conductive layer pattern 111 may not be provided under the bottom surface of the first spacer 116. The first conductive layer pattern 111 may be undercut from the bottom surface of the first spacer 116.

The second spacer 118a covers the surface of the first spacer 116, and the sidewalls of the first conductive layer pattern 111. The second spacer 118a is filled in a region provided under the bottom surface of the first spacer 116. Therefore, the second spacer 118a formed on the sidewall of the first conductive layer pattern 111 has a width wider than that of the second spacer 118a formed on the sidewall of the first spacer 116. The materials constituting the second spacer 118a are the same as the materials constituting the second spacer described according to the first example embodiment.

As described above, the bottom surface and the lateral side of the first conductive layer pattern 111 is surrounded by a dielectric layer having a high dielectric constant. Accordingly, the back tunneling caused by the concentration of the electric field on the edge region of the first conductive layer pattern 111 is reduced, so that the non-volatile memory device represent an improved erasing operation characteristic.

Figure 4A:
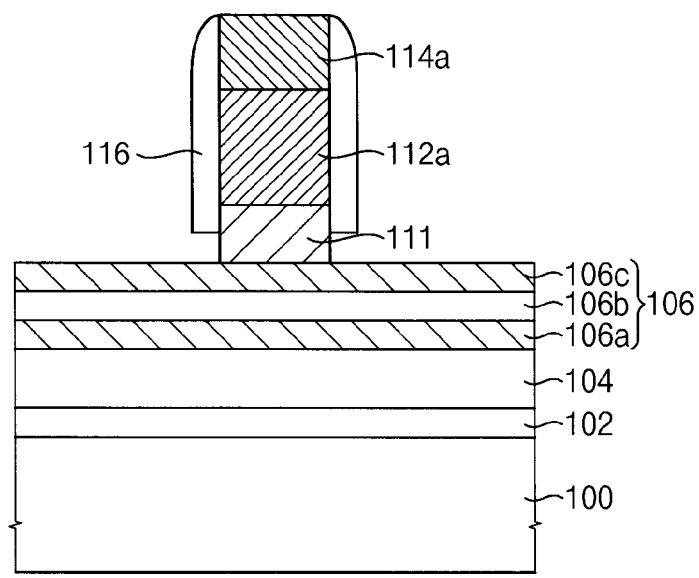
FIGS. 4A and 4B are cross-sectional views illustrating a method of forming the gate structure of FIG. 3.
Figure 4B:
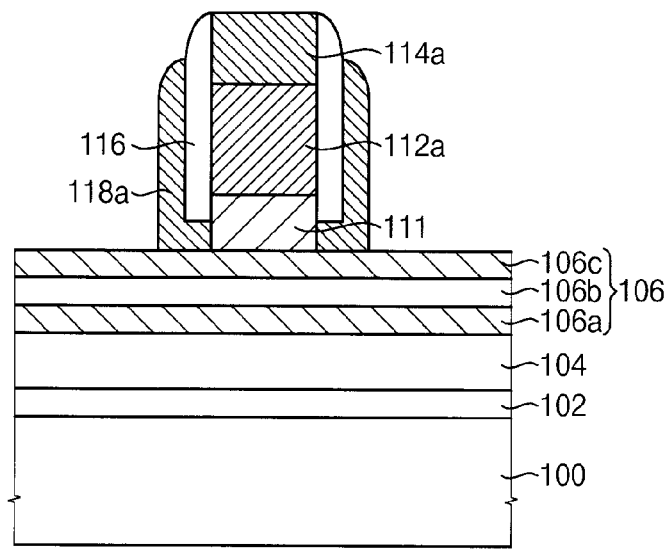

FIGS. 4A and 4B are cross-sectional views illustrating a method of forming the gate structure of FIG. 3.

First, the structure illustrated in FIG. 2C is formed by performing the processes the same as those described with reference to FIGS. 2A to 2C.

Referring to FIGS. 2C and 4A, the preliminary first conductive layer pattern 110a is isotropic-etched by using both of the first spacer 116 and the hard mask pattern 114a as an etching mask. When the above isotropic etching process is performed, the preliminary first conductive layer pattern 110a provided under the bottom surface of the first spacer 116 is etched to have a shape undercut from the bottom surface of the first spacer 116, thereby forming the first conductive layer pattern 111.

Referring to FIG. 4B, the second spacer 118a is formed from a second spacer layer (not illustrated). The second spacer layer is formed on the surface of the first spacer 116, and the second high dielectric layer 106c and the hard mask pattern 114a. The second spacer layer has a first dielectric constant equal to or greater than a second dielectric constant of the second high dielectric layer 106c positioned at the uppermost part of the blocking dielectric layer. The second spacer layer is filled in an undercut region provided under the bottom surface of the first spacer 116.

Thereafter, the second spacer 118a is formed on the sidewalls of the first spacer 116 and the first conductive layer pattern 111 by anisotropic-etching the second spacer layer.

As illustrated in drawings, since the sidewall of the first conductive layer pattern 111 is formed inward from the sidewall of the first spacer 116, the second spacer 118a has a wider width on the sidewall of the first conductive layer pattern 111.

Subsequently, as illustrated in FIG. 3, the second high dielectric layer 106c, the silicon oxide layer 106b, the first high dielectric layer 106a, the charge trap layer 104, and the tunnel oxide layer 102, which are provided under the second spacer 118a and the hard mask pattern 114a, are etched by using both of the second spacer 118a and the hard mask pattern 114a as an etching mask. Accordingly, the tunnel oxide layer pattern 102a, the charge trap layer pattern 104a, and the blocking dielectric layer pattern 108 are formed.

The gate structure is formed by performing the above processes.

Hereinafter, another method of forming the gate structure illustrated in FIG. 3 will be described.

First, the structure illustrated in FIG. 2d is formed by performing the processes the same as those described with reference to FIGS. 2a to 2d.

As illustrated in 4a, the first conductive layer pattern 110b is isotropic-etched by using both of the first spacer 116 and the hard mask pattern 114a as an etching mask. When the above isotropic etching process is performed, the first conductive layer pattern 110b provided under the bottom surface of the first spacer 116 may be etched, thereby forming the first conductive layer pattern 111 finally having a shape undercut from the bottom surface of the first spacer 116.

In other words, the first conductive layer pattern 110b the same as that illustrated in FIG. 2d is formed by anisotropic-etching the preliminary first conductive layer pattern 110a illustrated in FIG. 2c. Thereafter, a portion of the sidewall of the first conductive layer pattern 110b is isotropic-etched, thereby forming the first conductive layer pattern 111 of FIG. 4a which is the shape undercut from.

Thereafter, the gate structure of FIG. 3 can be formed by performing the processes the same as the processes described with reference to FIG. 4b.

Embodiment 3

Figure 5:
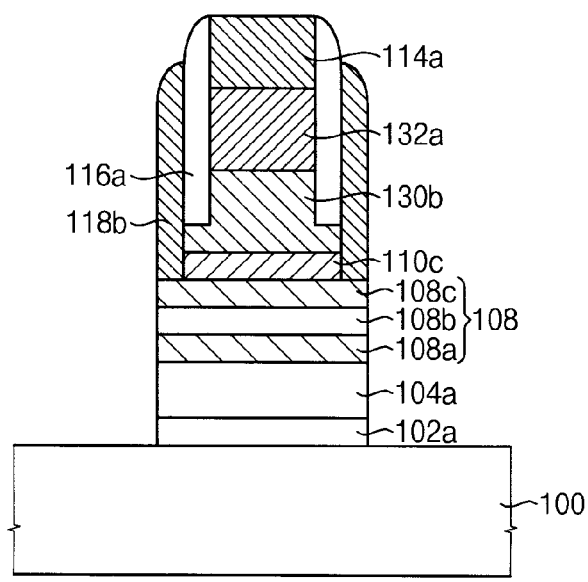

FIG. 5 is a cross-sectional view illustrating a gate structure provided in a non-volatile memory device according to a third example embodiment.

Referring to FIG. 5, the gate structure includes the tunnel oxide layer pattern 102a, the charge trap layer pattern 104a, the blocking dielectric layer pattern 108, a first conductive layer pattern 110c, a buffer conductive layer pattern 130b, a second conductive layer pattern 132a, and the hard mask pattern 114a which are sequentially stacked on the semiconductor substrate 100. In addition, the gate structure includes first and second spacers 116a and 118b, respectively, formed on a sidewall of the stacked structure.

The tunnel oxide layer pattern 102a, the charge trap layer pattern 104a, and the blocking dielectric layer pattern 108, which are formed on the semiconductor substrate 100, have the same structures as those according to the first example embodiment.

The first conductive layer pattern 110c, the buffer conductive layer pattern 130b, and the second conductive layer pattern 132a, which are formed on the blocking dielectric layer pattern 108, serve as a control gate.

The first conductive layer pattern 110c may include a metallic material having a work function of at least 4.0 eV. Example of materials used for the first conductive layer pattern 110c may include titanium (Ti), titanium nitride (TiN), tantalum (Ta), tantalum nitride (Ta$_2$N), etc. The above materials may be used alone or in a combination thereof.

Since the high dielectric layer is formed at the uppermost part of the blocking dielectric layer pattern 108, when polysilicon makes direct contact with an upper portion of the high dielectric layer, a Fermi level pinning may undesirably occur. Therefore, the use of polysilicon for the first conductive layer pattern 110c making direct contact with the blocking dielectric layer pattern 108 is undesirable.

The buffer conductive layer pattern 130b may include polysilicon. The buffer conductive layer pattern 130b is provided to easily perform a process of etching a gate electrode. Therefore, the buffer conductive layer pattern 130b may be thicker than the first conductive layer pattern 110c. The buffer conductive layer pattern 130b may be doped with impurities so that the buffer conductive layer pattern 130b is conductive.

A sidewall of the buffer conductive layer pattern 130b does not have a continuous flat surface, but protrudes at the lower portion thereof. Therefore, the lower portion of the buffer conductive layer pattern 130b has the first width, and the upper portion of the buffer conductive layer pattern 130b has the second width narrower than the first width. The protrusion part of the buffer conductive layer pattern 130b may have a flat top surface.

The second conductive layer pattern 132a has a flat surface continuously extending from an upper sidewall of the buffer conductive layer pattern 130b. For example, the second conductive layer pattern 132a may have the second width. The second conductive layer pattern 132a may serve as a wiring line. Therefore, the second conductive layer pattern 132a may include a metallic material having low resistance. According to one example embodiment, the second conductive layer pattern 132a may include tungsten (W).

The first spacer 116a is formed on a top surface of the protrusion part of the buffer conductive layer pattern 130b while being formed on both of a sidewall of the second conductive layer pattern 132a and an upper portion of the sidewall of the buffer conductive layer pattern 130b. The first spacer 116a may have a width equal to that of the protrusion part of the buffer conductive layer pattern 130b. Therefore, the first spacer 116a does not make direct contact with the blocking dielectric layer pattern 108. The first spacer 116a prevents the sidewalls of the second conductive layer pattern 132a that include a metallic material from being oxidized. Accordingly, the first spacer 116a may include silicon nitride ($Si_3N_4$).

The second spacer 118b makes contact with the sidewall of the first spacer 116a, the sidewall of the protrusion part of the buffer conductive layer pattern 130b, and the sidewall of the first conductive layer pattern 110c. The bottom surface of the second spacer 118b is positioned lower than the bottom surface of the first spacer 116a.

The second spacer 118b has a first dielectric constant equal to or greater than a second dielectric constant of a thin film positioned at the uppermost part of the blocking dielectric layer pattern 108. In other words, the second spacer 118b has the first dielectric constant equal to or greater than that of the second high dielectric layer 108c. In addition, the material constituting the second spacer 118b is the same as the material described according to the first and second embodiments.

As described above, the bottom surface and the lateral side of the first conductive layer pattern 110c is surrounded by a dielectric layer having a high dielectric constant. Accordingly, the back tunneling caused by the concentration of the electric field on the edge region of the first conductive layer pattern 110c is reduced, so that the non-volatile memory device represent an improved erasing operation characteristic.

FIGS. 6A to 6E are cross-sectional views illustrating a method of forming the gate structure of FIG. 5.

Figure 6A:
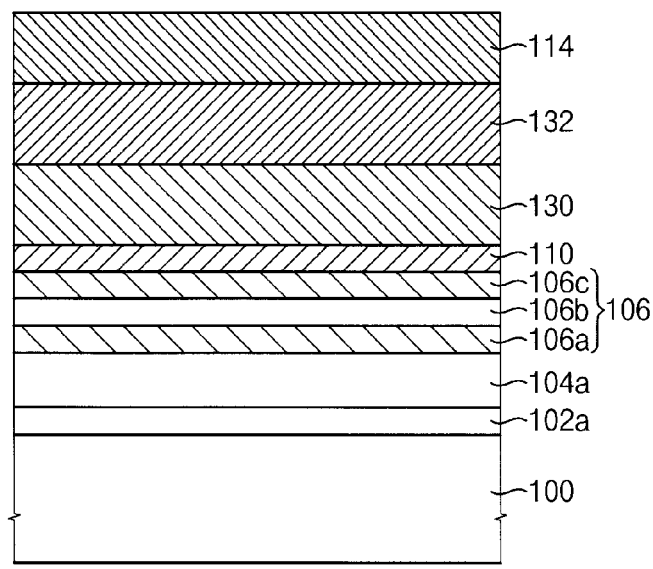
FIGS. 6A to 6E are cross-sectional views illustrating a method of forming the gate structure of FIG. 5.

Referring to FIG. 6A, the tunnel oxide layer 102, the charge trap layer 104, and the blocking dielectric layer 106 are sequentially formed on the semiconductor substrate 100. The processes of forming the above thin films are the same as those described according to the first example embodiment.

The first conductive layer 110 is formed on the blocking dielectric layer 106. The first conductive layer 110 may be formed by depositing barrier metallic materials. Examples of the barrier metallic materials used for the first conductive layer 110 may include titanium (Ti), titanium nitride (TiN), tantalum (Ta), tantalum nitride ($Ta_2N$), etc. The barrier metallic materials may be used alone or a stacked form including at least two materials. A buffer conductive layer 130 is formed on the first conductive layer 110 with a thickness thicker than that of the first conductive layer 110. The buffer conductive layer 130 is formed by depositing polysilicon. A second buffer layer 132 is formed on the buffer conductive layer 130. The second buffer layer 132 may be formed by depositing a metallic material having low resistance. The hard mask layer 114 is formed on the second conductive layer 132.

Figure 6B:
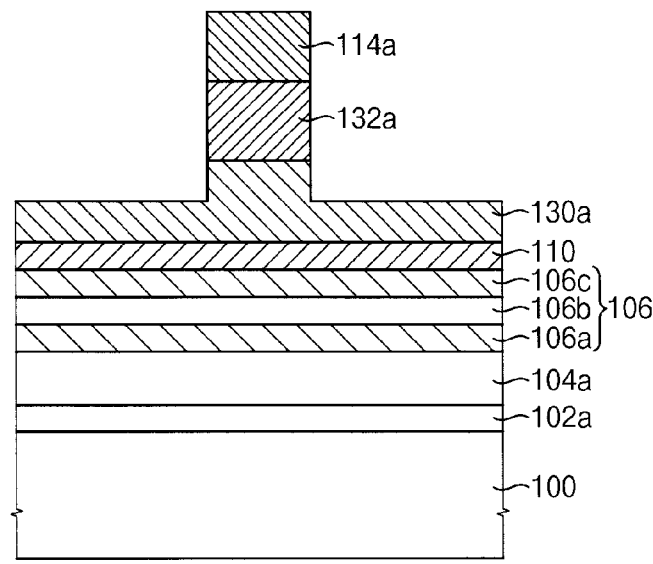

Referring to FIG. 6B, the hard mask pattern 114a is formed by patterning the hard mask layer 114 using a photoresist pattern.

The second conductive layer 132 is etched by using the hard mask pattern 114a so that the top surface of the buffer conductive layer 130 is exposed. Subsequently, a portion of the buffer conductive layer 130 is etched. The second conductive layer 132 and the buffer conductive layer 130 may be etched through an anisotropic etching process. In the above etching process, the process condition must be adjusted to etch a portion of the buffer conductive layer 130 by a desired (or alternatively, a predetermined) thickness. Since the buffer conductive layer 130 may have a thickness that is larger than that of the first conductive layer 110, an etching stop point can be easily detected in the etching process.

After the etching process has been performed, the second conductive layer pattern 132a and a preliminary buffer conductive layer pattern 130a are formed.

Figure 6C:
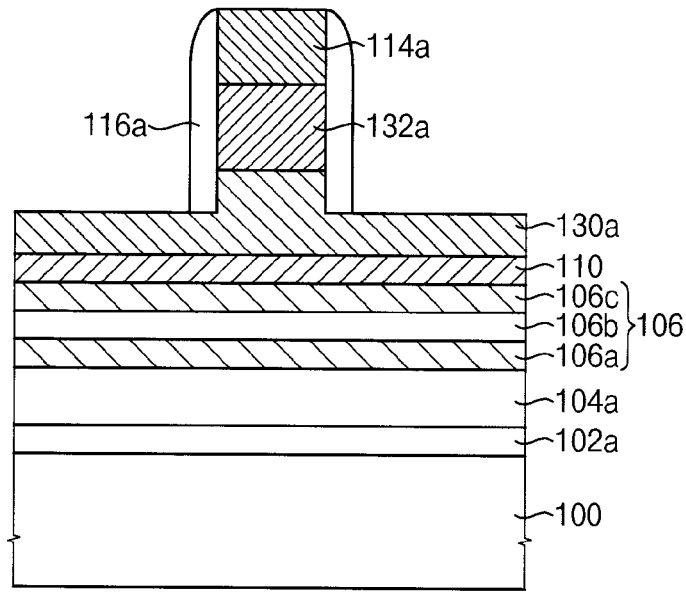

Referring to FIG. 6C, the first spacer 116a is formed from a first spacer layer (not illustrated). The first spacer layer is formed on the surfaces of the second conductive layer pattern 132a, the preliminary buffer conductive layer pattern 130a, and the hard mask pattern 114a. The first spacer layer may be formed by depositing silicon nitride.

The first spacer 116a is formed by anisotropic-etching the first spacer layer. The first spacer 116a is formed on the sidewall of the second conductive layer pattern 132a and the sidewall of the preliminary buffer conductive layer pattern 130a.

Figure 6D:
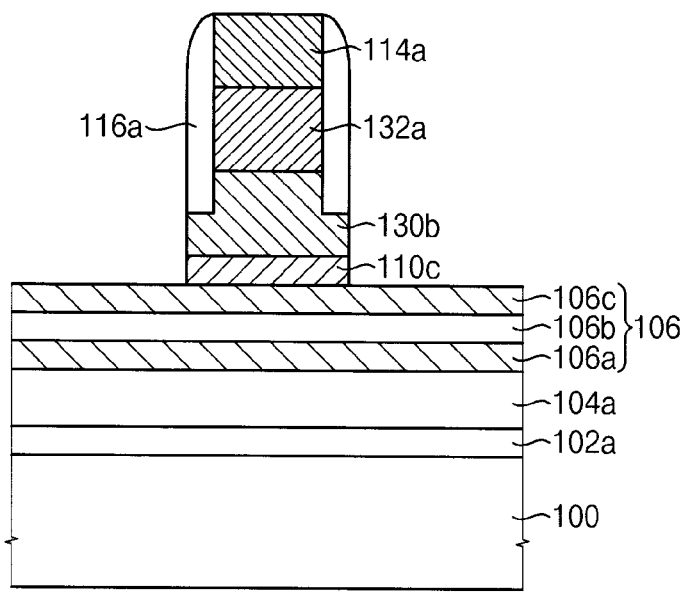

Referring to FIG. 6D, the preliminary buffer conductive layer pattern 130a and the first conductive layer 110 are anisotropic-etched by using the first spacer 116a and the hard mask pattern 114a as an etching mask, thereby forming the buffer conductive layer pattern 130b and the first conductive layer pattern 110c.

The lower portion of the buffer conductive layer pattern 130b and the first conductive layer pattern 110c protrude in a lateral direction.

Figure 6E:
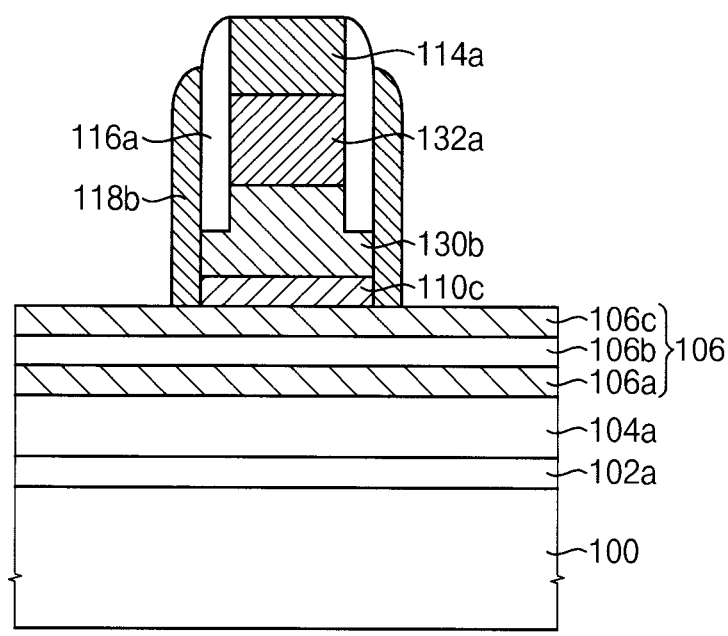

Referring to FIG. 6E, the second spacer 118b is formed from a second spacer layer (not illustrated). The second spacer layer is formed on the surface of the first spacer 116a, the second high dielectric layer 118b, and the hard mask pattern 114a. The second spacer layer may include a material the same as that described according to the first and second embodiments.

Thereafter, the second spacer 118b is formed on the sidewalls of the first spacer 116a, the first conductive layer pattern 110c, and a protrusion part of the buffer conductive layer pattern 130b by anisotropic-etching the second spacer layer.

Subsequently, as illustrated in FIG. 5, the second high dielectric layer 106c, the silicon oxide layer 106b, the first high dielectric layer 106a, the charge trap layer 104, and the tunnel oxide layer 102, which are provided under the second spacer 118b and the hard mask pattern 114a, are etched by using both of the second spacer 118b and the hard mask pattern 114a as an etching mask. Accordingly, the tunnel oxide layer pattern 102a, the charge trap layer pattern 104a, and the blocking dielectric layer pattern 108 are formed.

The gate structure may be formed by performing the above processes.

The gate structure according to each example embodiment described above is applicable to the non-volatile memory device.

Embodiment 4

Figure 7:
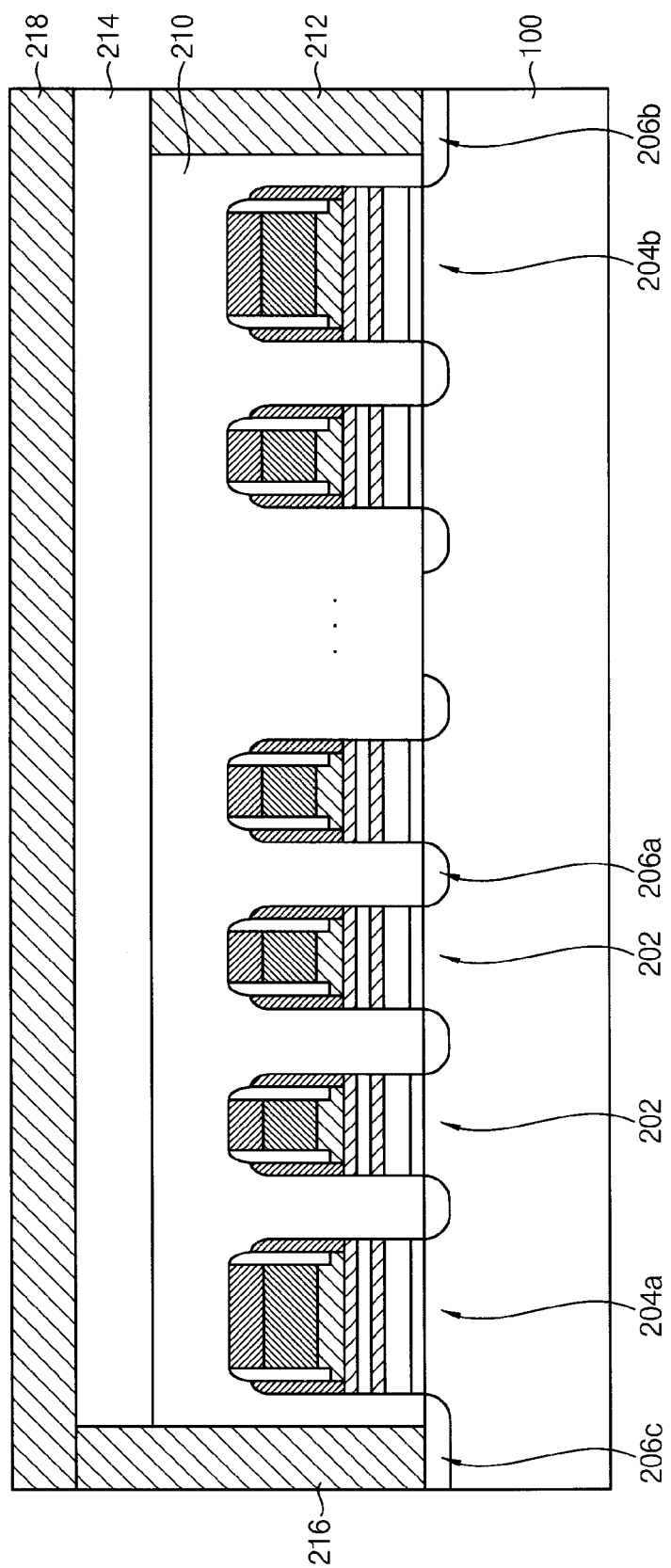

FIG. 7 is a cross-sectional view illustrating a non-volatile memory device according to an example embodiment.

Referring to FIG. 7, the non-volatile memory device includes gate structures illustrated in FIG. 1A. The gate structures serve as gates of a cell transistor 202 and select transistors 204a and 204b. First to third impurity regions 206a, 206b, and 206c, respectively, are formed between the gate structures in the semiconductor substrate 100. In addition, the non-volatile memory device further includes a common source line (CSL) 212 and a bit line 218.

The gate structures have the shape of a line extending in a second direction, and are spaced apart from each other in a first direction perpendicular to the second direction.

A first insulating interlayer 210 is formed on the semiconductor substrate 100 to cover the gate structure.

The CSL 212 makes contact with the second impurity region 206b while passing through the first insulating interlayer 210. The CSL 212 may include doped polysilicon, metal, or metallic silicide.

A second insulating interlayer 214 is formed on both of the first insulating interlayer 210 and the CSL 212. A bit line contact 216 is formed to make contact with the third impurity region 206c while passing through the first and second insulating interlayers 210 and 214. A bit line 218 electrically connected to the bit line contact 216 is formed on the second insulating interlayer 214. The bit line 218 extends in the first direction.

As described above, the non-volatile memory device including the gate structure of the example embodiments has improved erase saturation characteristics and improved reliability as compared to a conventional charge-trap non-volatile memory device.

Although the present example embodiment employs the gate structure according to the first example embodiment, the non-volatile memory device may employing the gate structures according to the second and third example embodiments may be provided.

Figure 8A:
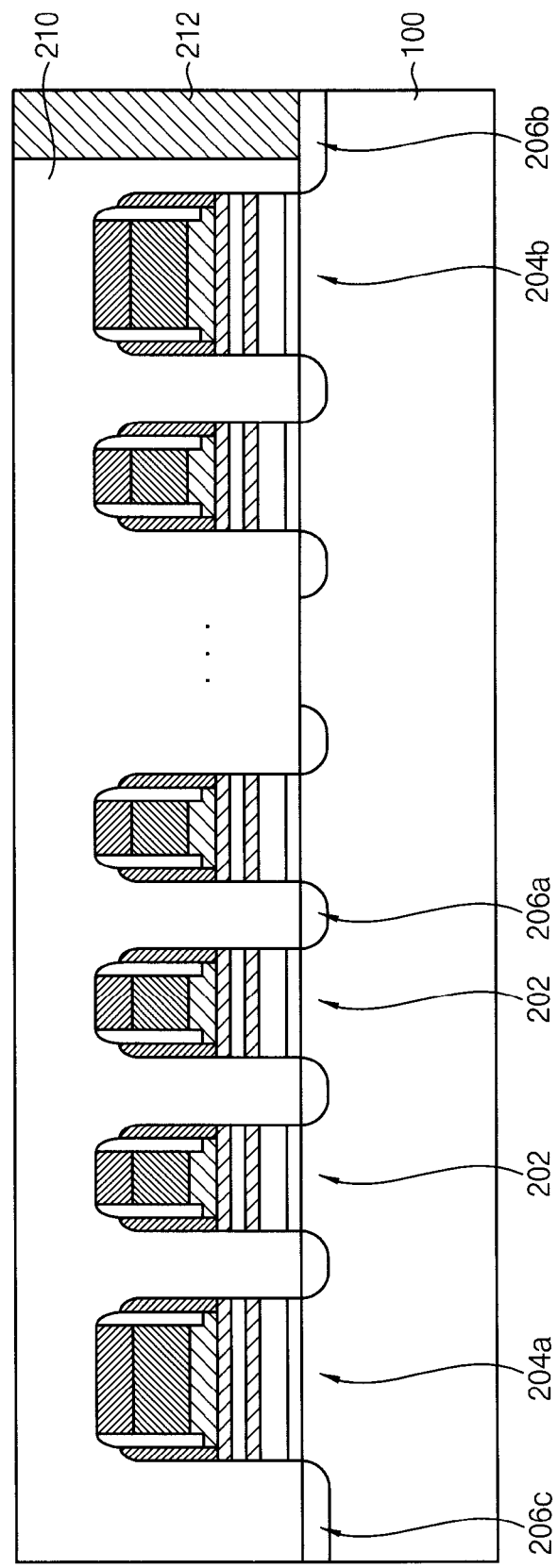
FIGS. 8A and 8B are cross-sectional views illustrating a method of fabricating the non-volatile memory device of FIG. 7.
Figure 8B:
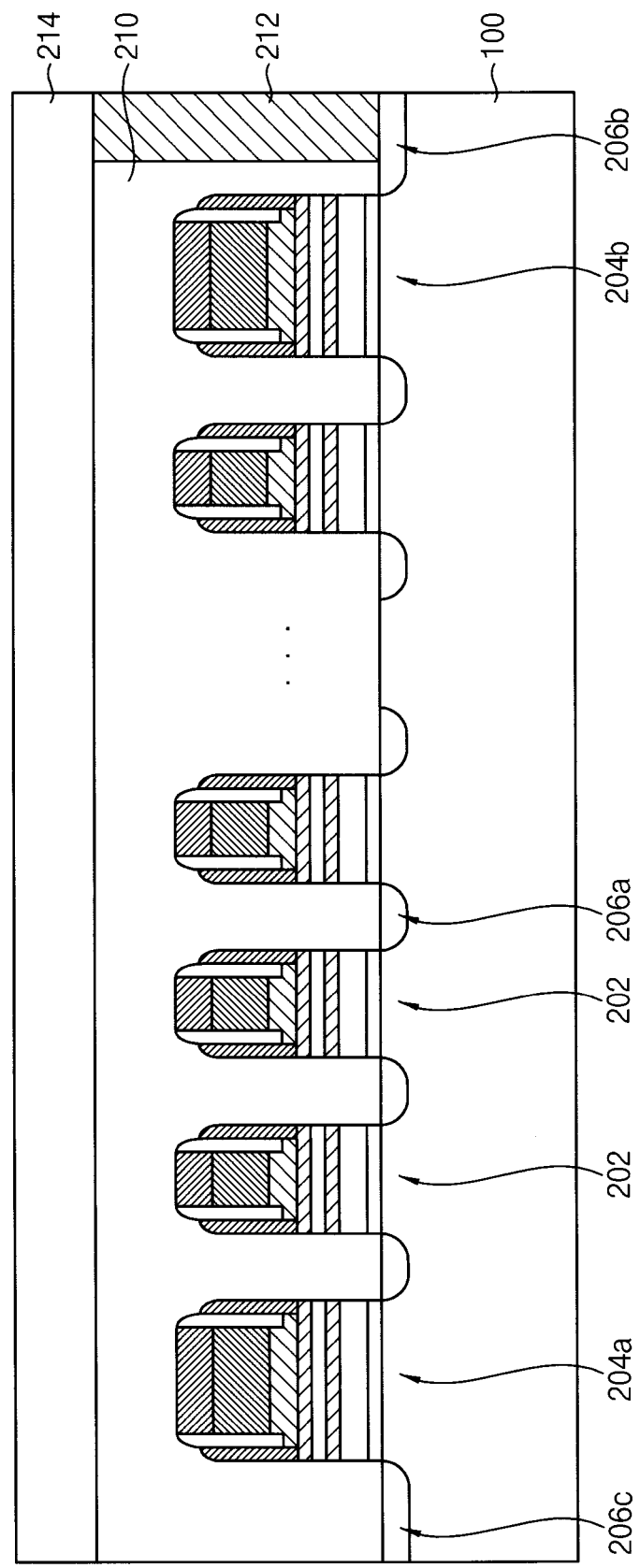

FIGS. 8A and 8B are cross-sectional views illustrating a method of fabricating the non-volatile memory device of FIG. 7.

Gate structures are formed on the semiconductor substrate 100 by performing the processes described with reference to FIGS. 2A to 2E. The gate structures have the shape of a line extending in the second direction.

Referring to FIG. 8A, the first to third impurity regions 206a, 206b, and 206c are formed by implanting impurities into the semiconductor substrate 100 formed between the gate structures.

The first insulating interlayer 210 is formed on the semiconductor substrate 100 to cover the gate structures. The first insulating interlayer 210 may be formed by performing a CVD process, an ALD process, or a sputtering process using oxide such as boron phosphorous silicate glass (BPSG), undoped silicate glass (USG), or spin on glass (SOG).

A first opening (not illustrated) is formed to expose the second impurity region 206b while passing through the first insulating interlayer 210, and a conductive layer is formed in the first opening and on the first insulating interlayer 210. The first opening may have the shape of a line extending in the second direction. The conductive layer may be formed by using doped polysilicon, metal, or metallic silicide. The upper portion of the conductive layer is planarized until the first insulating interlayer 210 is exposed, thereby forming the CSL 212 making contact with the second impurity region 206b in the first opening.

Referring to FIG. 8B, the second insulating interlayer 214 is formed on the first insulating interlayer 210 and the CSL 212. The second insulating interlayer 214 may be formed by performing a CVD process, an ALD process, or a sputtering process using oxide such as BPSG, USG, or SOG.

Thereafter, as illustrated in FIG. 7, a second opening (not illustrated) is formed to expose the third impurity region 206c while passing through the first and second insulating interlayers 210 and 214, and a conductive layer is formed in the second opening and on the second insulating interlayer 214. The conductive layer may be formed by using doped polysilicon, metal, or metallic silicide. The upper portion of the conductive layer is planarized until the second insulating interlayer 214 is exposed, thereby forming the CSL 216 making contact with the third impurity region 206c in the second opening.

In addition, the bit line 218 electrically connected to the bit line contact 216 is formed by depositing a conductive layer on the second insulating interlayer 214 and patterning the conductive layer. The bit line 218 may have a linear shape extending in the second direction. The conductive layer may be formed by using doped polysilicon, metal, or metallic silicide.

The non-volatile memory device illustrated in FIG. 7 may be formed by performing the processes described with reference to FIGS. 8A and 8B.

Embodiment 5

Figure 9A:
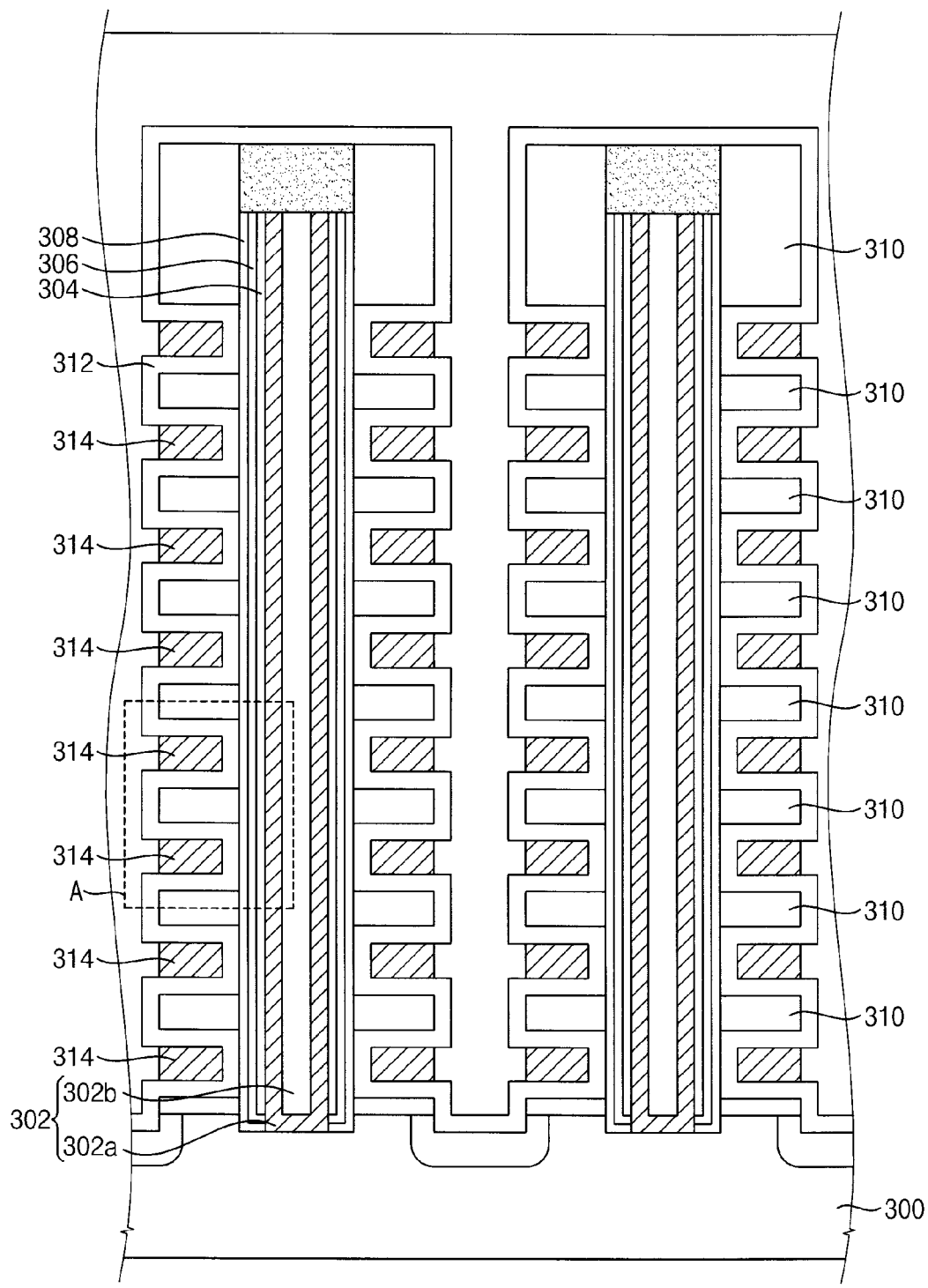
FIG. 9A is a cross-sectional view illustrating a vertical type non-volatile memory device according to another example embodiment.
Figure 9B:
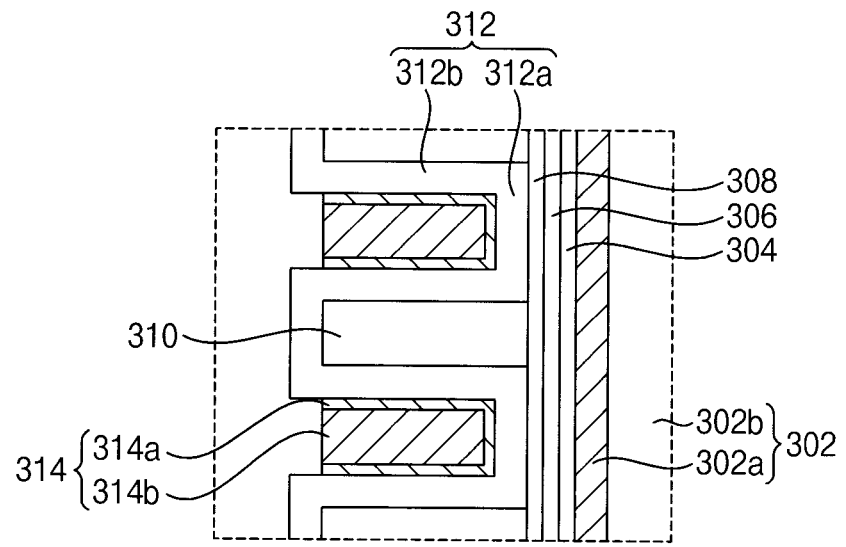
FIG. 9B is an enlarged view illustrating a part A of FIG. 9A.

FIG. 9A is a cross-sectional view illustrating a vertical type non-volatile memory device according to one example embodiment. FIG. 9b is an enlarged view illustrating a part A of FIG. 9A, shown in a dotted area of FIG. 9A.

Referring to FIGS. 9A and 9B, the vertical type non-volatile memory device may include channel patterns 302 and control gate electrodes 314 serving as word lines, the channel patterns 302 and word lines are formed on a substrate 300.

The substrate 300 may include a semiconductor substrate such as a silicon substrate, a germanium substrate, or a silicon-germanium substrate.

The channel patterns 302 may vertically extend from a top surface of the substrate 300 with a desired (or alternatively, a predetermined) height. Each channel pattern 302 may have a pillar shape, cylindrical shape or a rectangular parallelepiped shape. At least the surface of the channel pattern 302 may include a semiconductor material. For example, the entire portion of the channel pattern 302 may include a semiconductor material. Alternately, the outer portion of the channel pattern 302 may include a semiconductor material 302a, and the inner portion of the channel pattern 302 may include an insulating material 302b. The semiconductor material 302a may include single crystal silicon or polysilicon.

A tunnel oxide layer 304 is formed on the surface of the sidewall of the channel pattern 302. In addition, a charge trap layer 306 is formed on the tunnel oxide layer 304. A first blocking dielectric layer 308 is formed on the charge trap layer 306. The first blocking dielectric layer 308 may include a plurality of dielectric layers. In some example embodiments, the first blocking dielectric layer 308 may include a silicon oxide layer. In some example embodiments, the first blocking dielectric layer 308 may have a structure in which a silicon oxide layer and a first high dielectric layer are stacked on each other.

Insulating interlayer patterns 310 are formed in a lateral direction of the channel pattern 302 formed thereon with the first blocking dielectric layer 308. The insulating interlayer patterns 310 are vertically spaced apart from each other. Accordingly, recess parts are formed between the insulating interlayer patterns 310.

A second blocking dielectric layer 312 is formed on the first blocking dielectric layer 308 and the insulating interlayer pattern 310 in the recess parts. In some example embodiments, the second blocking dielectric layer 312 may vertically extend as illustrated in FIG. 9A. In other example embodiments, the second blocking dielectric layer 312 may be formed only in the recess parts of the insulating interlayer pattern 310.

The second blocking dielectric layer 312 may have a dielectric constant greater than those of the dielectric layers constituting the first blocking dielectric layer 308. In other words, a material constituting the first blocking dielectric layer 308 may be different from a material constituting the second blocking dielectric layer 312. In some example embodiments, the second blocking dielectric layer 312 may include a material having the highest dielectric constant among materials constituting the dielectric layers of the first blocking dielectric layer 308.

The second blocking dielectric layer 312 includes a first part 312a making contact with a sidewall part of the channel pattern 302 and a second part 312b protruding from the sidewall part of the channel pattern 302 on the end portion of the first part 312a.

The second blocking dielectric layer 312 may include a material having a dielectric constant of at least 3.9. The second blocking dielectric layer 312 may include metallic oxide.

Each of the control gate electrodes 314 is formed on the second blocking dielectric layer 312 to fill the recess parts. The control gate electrodes 314 serve as the word lines. The word lines 314 may have the shape of a multi-layer structure, and may be vertically stacked. The word lines 314 may include a metallic material.

Each word line 314 may include a barrier metallic layer pattern 314a and a metallic layer pattern 314b.

The metallic layer pattern 314b may include tungsten (W). The barrier metallic layer pattern 314a may include titanium (Ti), titanium nitride (TiN), tantalum (Ta), or tantalum nitride (Ta$_2$N). The above materials may be used alone or in a combination thereof. The barrier metallic layer pattern 314a makes direct contact with the second blocking dielectric layer 312.

As illustrated in FIGS. 9A and 9B, the second blocking dielectric layer 312 is disposed between the word line 314 and the first blocking dielectric layer 308. In addition, the second blocking dielectric layer 312 makes direct contact with upper and lower portions of the word line 314. The second part 312b of the second blocking dielectric layer 312, which makes contact with the upper and lower portions of the word line 314, serves as a second spacer having a high dielectric constant according to the first example embodiment.

As described above, the upper and lower portions of the word line 314 are surrounded by a dielectric layer having a high dielectric constant. Accordingly, the back tunneling caused by the concentration of the electric field on the bending portion of the word line 314 is reduced, so that the vertical type non-volatile memory device of the example embodiments have improved erasing operation characteristics.

Embodiment 6

Figure 10:
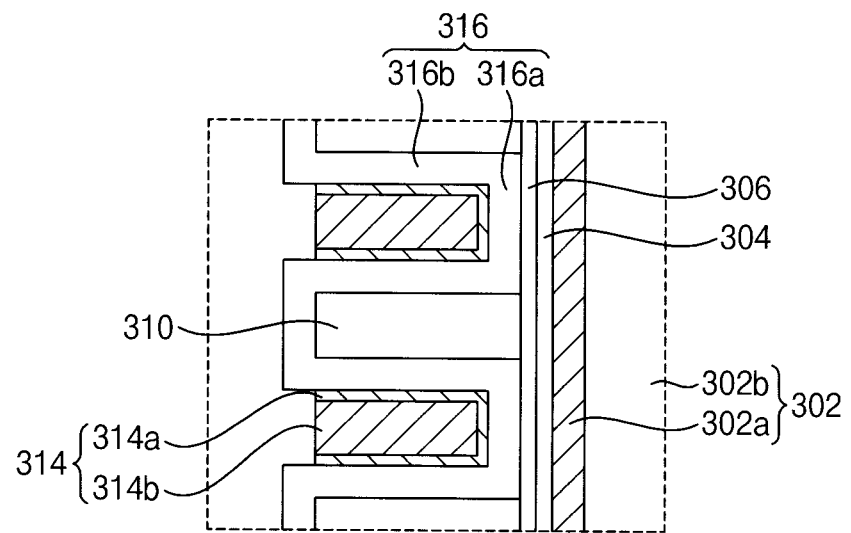

FIG. 10 is a cross-sectional view illustrating a vertical type non-volatile memory device according to another example embodiment.

The vertical type non-volatile memory device of FIG. 10 has the same structure as that of the vertical type non-volatile memory device according to the example embodiment of FIG. 9 except the vertical type non-volatile memory device illustrated in FIG. 10 does not have the first blocking dielectric layer pattern 308 and the second blocking dielectric layer pattern 312 and instead of the vertical type non-volatile memory device illustrated in FIG. 10 has a single blocking dielectric layer 316.

Referring to FIG. 10, the tunnel oxide layer 304 is formed on the surface of the channel pattern 302. In addition, the charge trap layer 306 is formed on the tunnel oxide layer 304.

The insulating interlayer patterns 310 are formed in a lateral direction of the channel pattern 302 formed thereon with the charge trap layer 306. The insulating interlayer patterns 310 are vertically spaced apart from each other. Accordingly, recess parts are formed between the insulating interlayer patterns 310.

The blocking dielectric layer 316 is formed on the charge trap layer 306 and the insulating interlayer pattern 310 in the recess parts. The blocking dielectric layer 316 includes a first part 316a making contact with the sidewall part of the channel pattern 302 and a second part 316b protruding from the sidewall part of the channel pattern 302 on the end portion of the part 312a.

The blocking dielectric layer 316 may include a material having a dielectric constant of at least 3.9. The blocking dielectric layer 316 may include metallic oxide.

Each of the word lines 314 are formed in the recess parts having the blocking dielectric layer 316 therein. Each of the word lines 314 have the same structure as that described with reference to FIGS. 9A and 9B.

The blocking dielectric layer 316 may include a plurality of dielectric layers. When the blocking dielectric layer 316 includes a plurality of dielectric layers, a dielectric layer making direct contact with the word line may have a dielectric constant greater than those of other dielectric layers.

As described above, the upper and lower portions of the word line 314 are surrounded by a dielectric layer having a high dielectric constant. In other words, the second part 316b of the blocking dielectric layer serves as the second spacer provided with a high dielectric constant according to the first example embodiment. Accordingly, the back tunneling caused by the concentration of the electric field in the edge portions of the word line 314 is reduced, so that the vertical type non-volatile memory devices of the example embodiments have improved erasing operation characteristics.

Embodiment 7

Figure 11A:
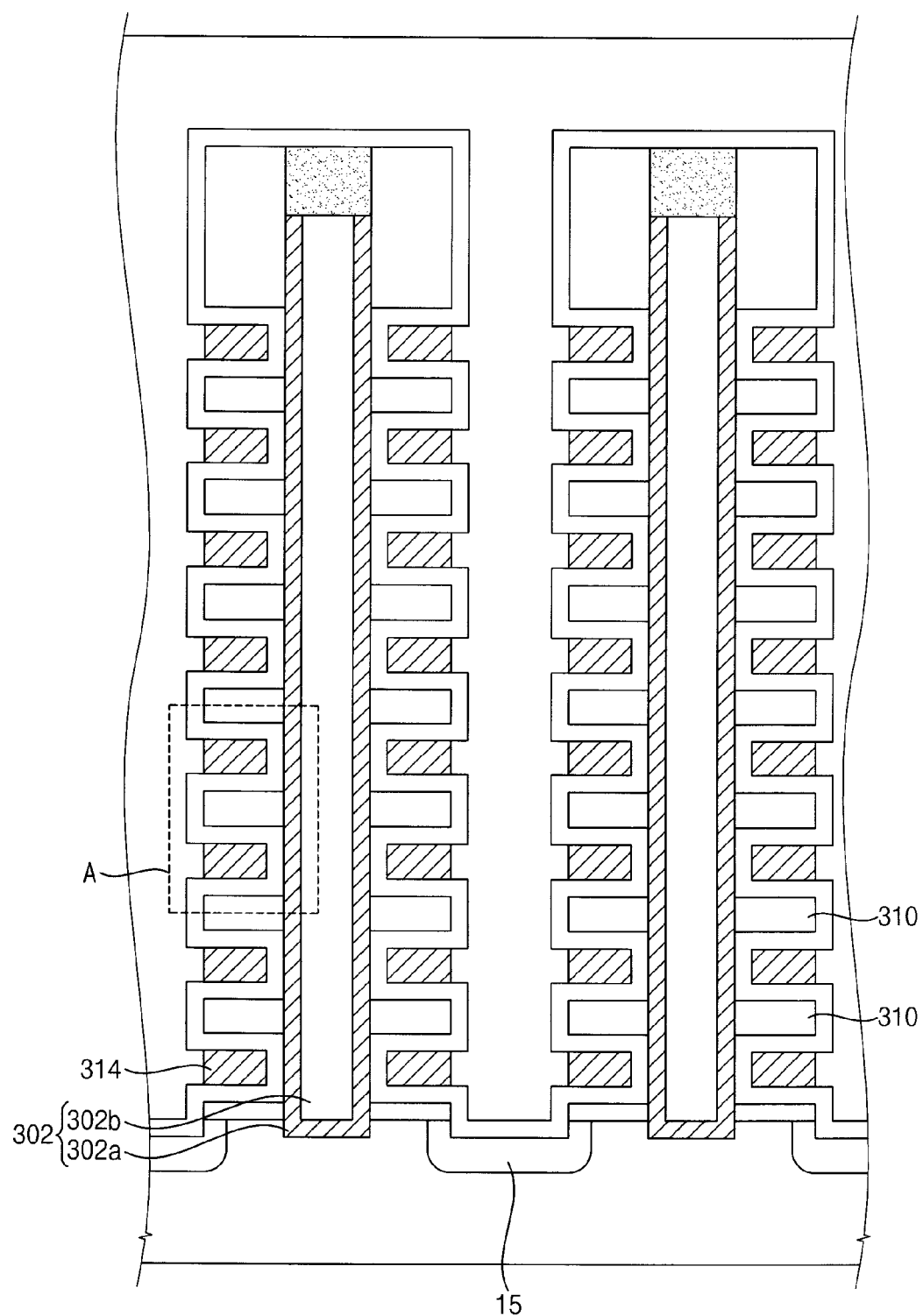
FIG. 11A is a cross-sectional view illustrating a vertical type non-volatile memory device according to another example embodiment.
Figure 11B:
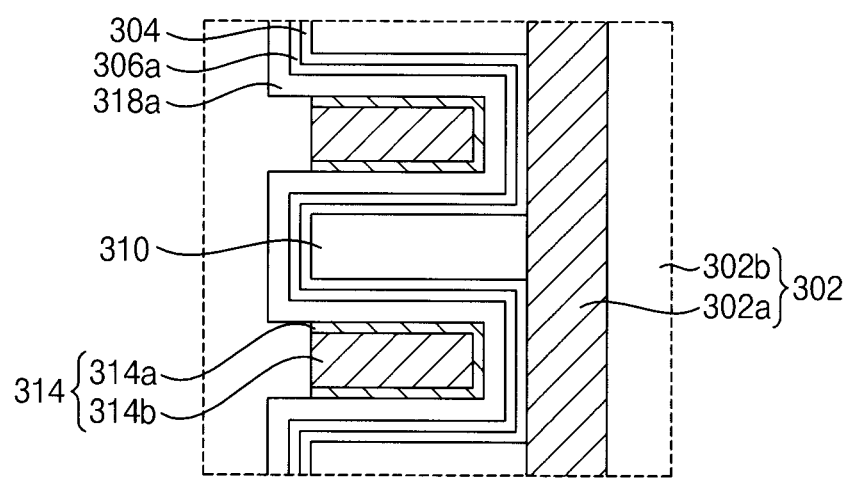
FIG. 11B is an enlarged view illustrating a part A of FIG. 11A.

FIG. 11a is a cross-sectional view illustrating a vertical type non-volatile memory device according to another example embodiment. FIG. 11B is an enlarged view illustrating a part A of FIG. 11A, shown in a dotted area of FIG. 11A.

Referring to FIGS. 11A and 11B, the vertical type non-volatile memory device may include channel patterns 302 and control gate electrodes 314 serving as word lines, the channel patterns 302 and word lines are formed on the substrate 300.

The substrate 300 may include a semiconductor substrate such as a silicon substrate, a germanium substrate, or a silicon-germanium substrate.

The channel patterns 302 may vertically extend from a top surface of the substrate 300 with a desired (or alternatively, a predetermined) height. Each channel pattern 302 may have a pillar shape, a cylindrical shape or a rectangular parallelepiped shape. At least the surface of the channel pattern 302 may include a semiconductor material. For example, the entire portion of the channel pattern 302 may include a semiconductor material. Alternately, the outer portion of the channel pattern 302 may include a semiconductor material 302a, and the inner portion of the channel pattern 302 may include an insulating material 302b. The semiconductor material 302a may include single crystal silicon or polysilicon.

The insulating interlayer patterns 310 are formed in a lateral direction of the channel pattern 302. The insulating interlayer patterns 310 are vertically spaced apart from each other. Accordingly, recess parts are formed between the insulating interlayer patterns 310.

A tunnel oxide layer 304a is formed on the surface of the channel pattern 302 and the insulating interlayer pattern 310 in the recess parts. The tunnel oxide layer 304a includes a part making contact with the channel pattern 302 and a part making contact with the surface of the insulating interlayer pattern 310.

A charge trap layer 306a and a blocking dielectric layer 318a are formed on the surface of the tunnel oxide layer 304a. The blocking dielectric layer 318a may include a material having a dielectric constant of at least 3.9. The blocking dielectric layer 318a may include metallic oxide.

The blocking dielectric layer 318a may include a plurality of dielectric layers.

Each of the control gate electrodes are formed on the blocking dielectric layer 318a to fill the recess parts. The control gate electrodes serve as the word lines 314. The word lines 314 may have the shape of a multi-layer structure, and vertically stacked. The word lines 314 may have the same structure as that of the word lines described with reference to FIGS. 9A and 9B.

If the blocking dielectric layer 318a includes a plurality of dielectric layers, a dielectric layer making direct contact with the word line 314 may have a dielectric constant greater than those of other dielectric layers.

As illustrated in FIGS. 11A and 11B, the blocking dielectric layer 318a having a high dielectric constant makes direct contact with upper and lower portions of the word line 314. The blocking dielectric layer 318a making contact with the upper and lower portions of the word line 314 serves as the second spacer provided with a high dielectric constant according to the first example embodiment.

Accordingly, the back tunneling caused by the concentration of the electric field on the edge portions of the word line 314 is reduced, so that the vertical type non-volatile memory devices of the example embodiments have improved erasing operation characteristics.

Embodiment 8

Figure 12A:
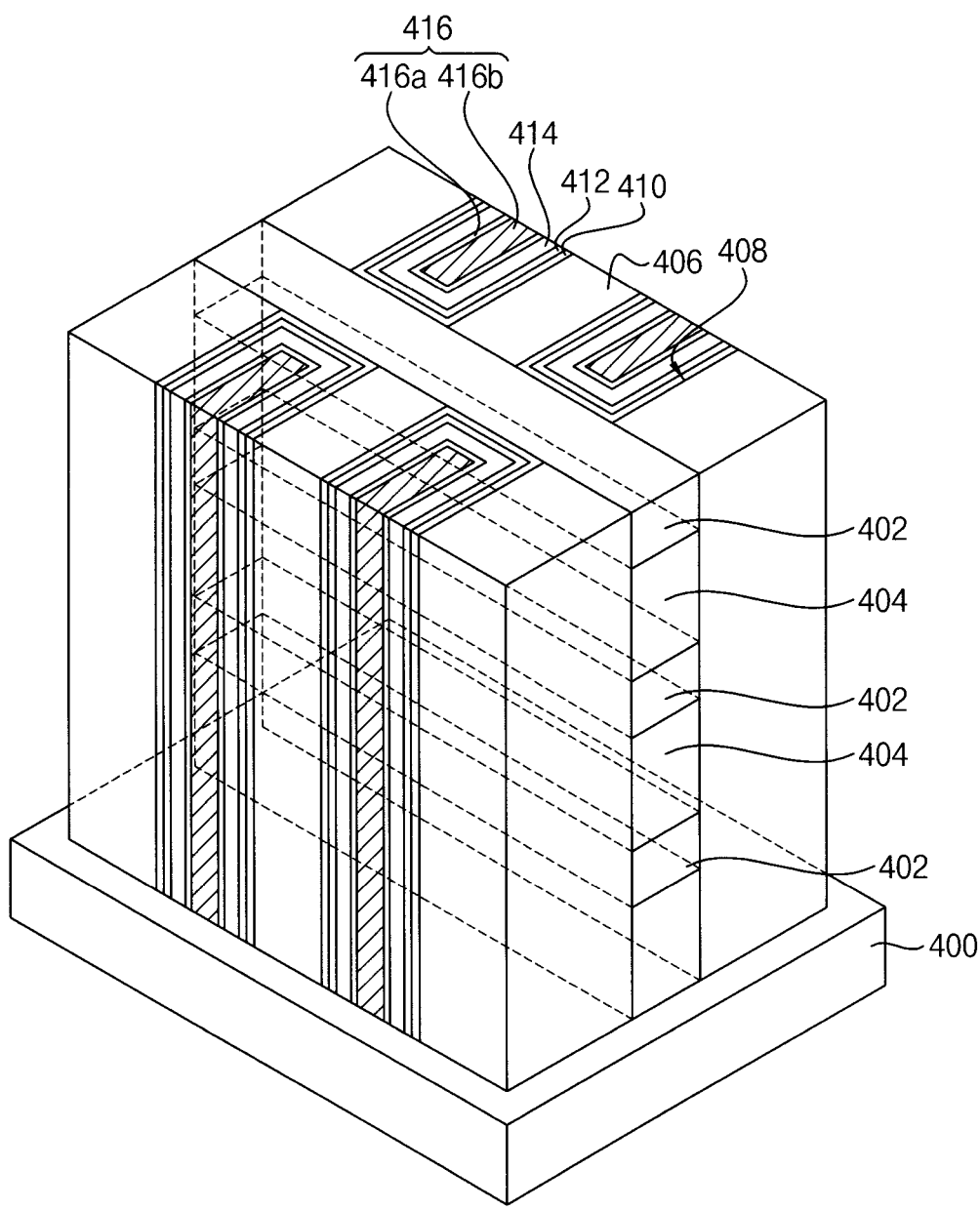
FIG. 12A is a perspective view showing a part of a vertical gate type non-volatile memory device according to another example embodiment.
Figure 12B:
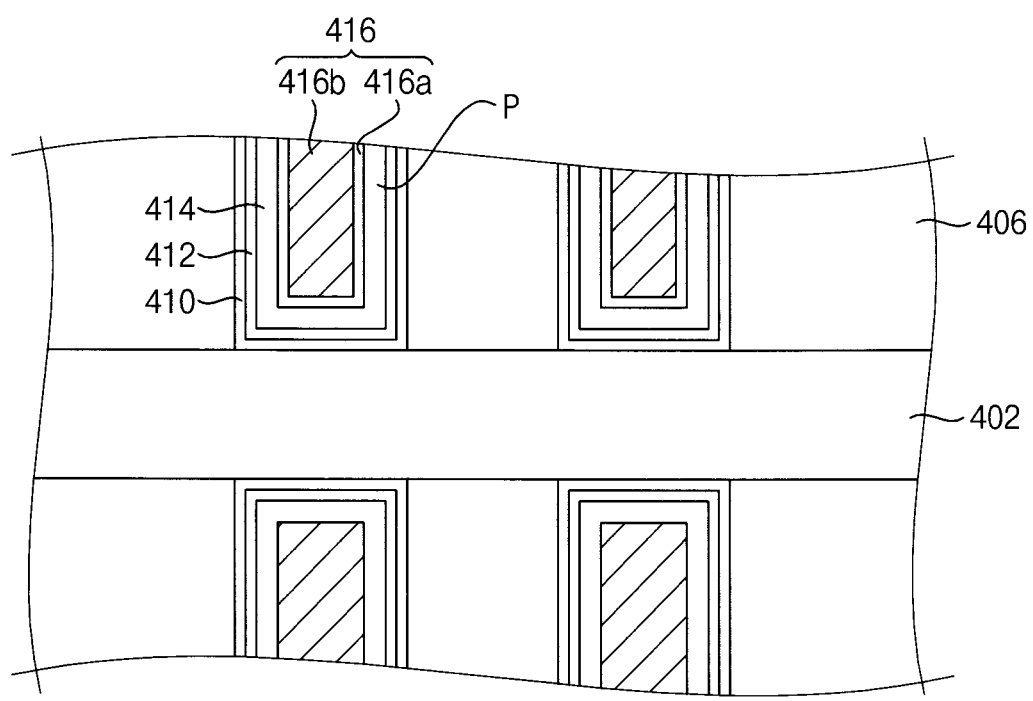
FIG. 12B is a plan view of FIG. 12A.

FIG. 12A is a perspective view showing a part of a vertical gate type non-volatile memory device according to another example embodiment, and FIG. 12B is a plan view of FIG. 12A.

Referring to FIGS. 12A and 12B, the vertical gate type non-volatile memory device may include channel patterns 402 having a multi-layer structure and word lines 416 having the shape of pillars which are formed on the substrate 400 while facing the sidewalls of the channel patterns 402.

The channel patterns 402 have the shape of a line extending in the first direction. The channel patterns 402 are stacked while interposing a first insulating interlayer pattern 404 there between. In other words, first insulating interlayer patterns 404 and the channel patterns 402 may be repeatedly and alternately stacked on the substrate. The channel patterns 402 include a semiconductor material. For example, the channel patterns 402 may include a single crystal silicon or polysilicon.

Second insulating interlayer patterns 406 having the shape of pillars are formed at the lateral side of the structure in which the first insulating interlayer patterns 404 and the channel patterns 402 are stacked on each other. Openings 408 are defined between the second insulating interlayer patterns 406 to expose both sidewalls of the channel patterns 402.

A tunnel oxide layer 410, a charge trap layer 412, and a blocking dielectric layer 414 are formed on the sidewall of the opening 408 and the channel pattern 402. The blocking dielectric layer 414 may include a plurality of dielectric layers.

The blocking dielectric layer 414 may include a material having a dielectric constant of at least 3.9. The blocking dielectric layer 414 may include metallic oxide. When the blocking dielectric layer 414 has a multi-layer structure, the blocking dielectric layer 414 making direct contact with the word line 416 has a dielectric constant greater than those of the blocking dielectric layers 414 formed at other layers.

The word lines 416 are formed in the openings 408 while making contact with the blocking dielectric layers 414. In other words, the word lines 416 have the shape of a pillar.

The word lines 416 may include a metallic material. The word line 416 may include a barrier metallic layer pattern 416a and a metallic layer pattern 416b.

The metallic layer pattern 416b may include tungsten (W). The barrier metallic layer pattern 416a may include titanium (Ti), titanium nitride (TiN), tantalum (Ta), or tantalum nitride ($Ta_2N$). The above materials may be used alone or in a combination thereof. The barrier metallic layer pattern 416a may make direct contact with the blocking dielectric layer 414.

The word line 416 is surrounded by the blocking dielectric layer 414. A portion P of the blocking dielectric layer 414 protruding in a lateral direction of the channel pattern 402 serves as the second spacer provided with a high dielectric constant according to the first example embodiment. Accordingly, the back tunneling caused by the concentration of the electric field on the edge portions of the edge region of the word line 416 is reduced, so that the non-volatile memory device of the example embodiments have improved erasing operation characteristics.

Figure 13A:
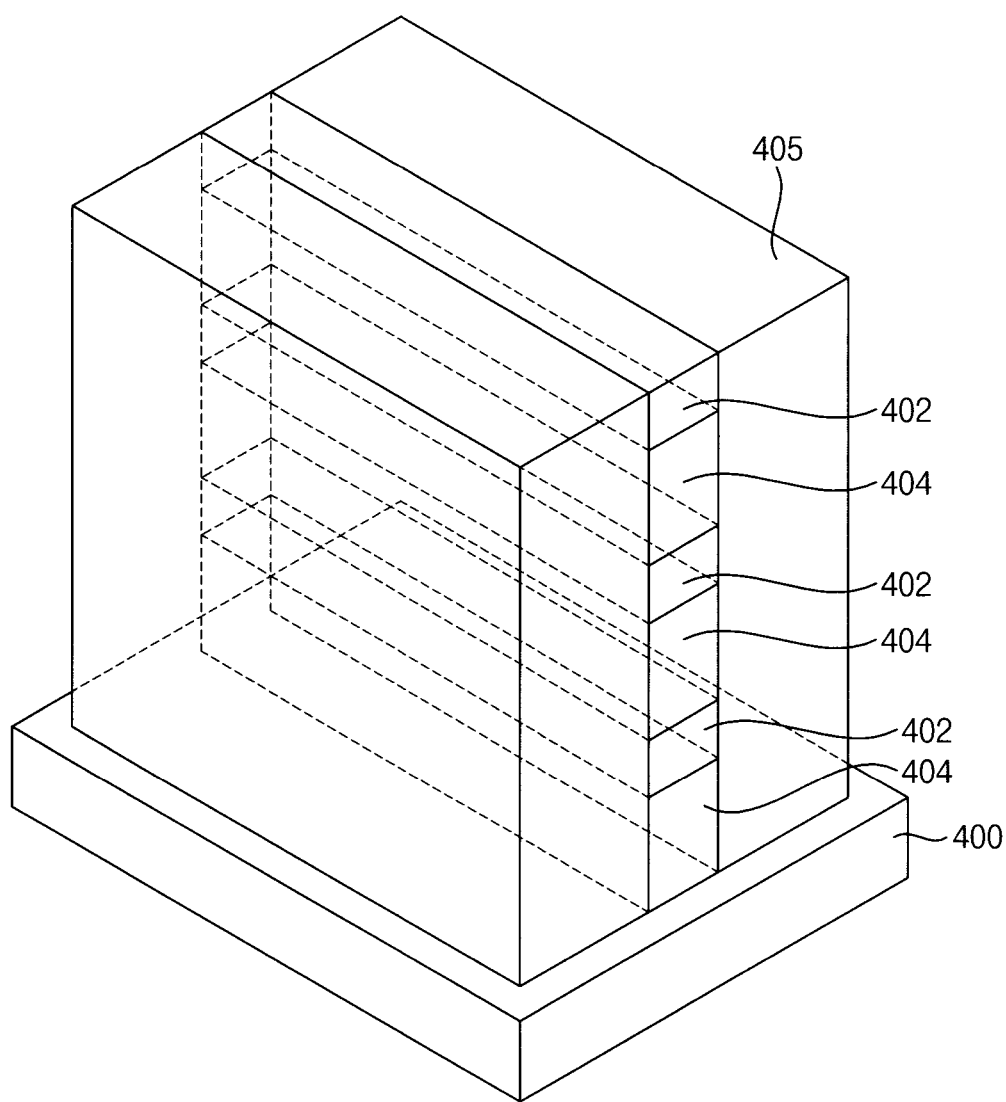
FIGS. 13A and 13B are perspective views showing a method of fabricating the vertical gate type non-volatile memory device of FIG. 12A.
Figure 13B:
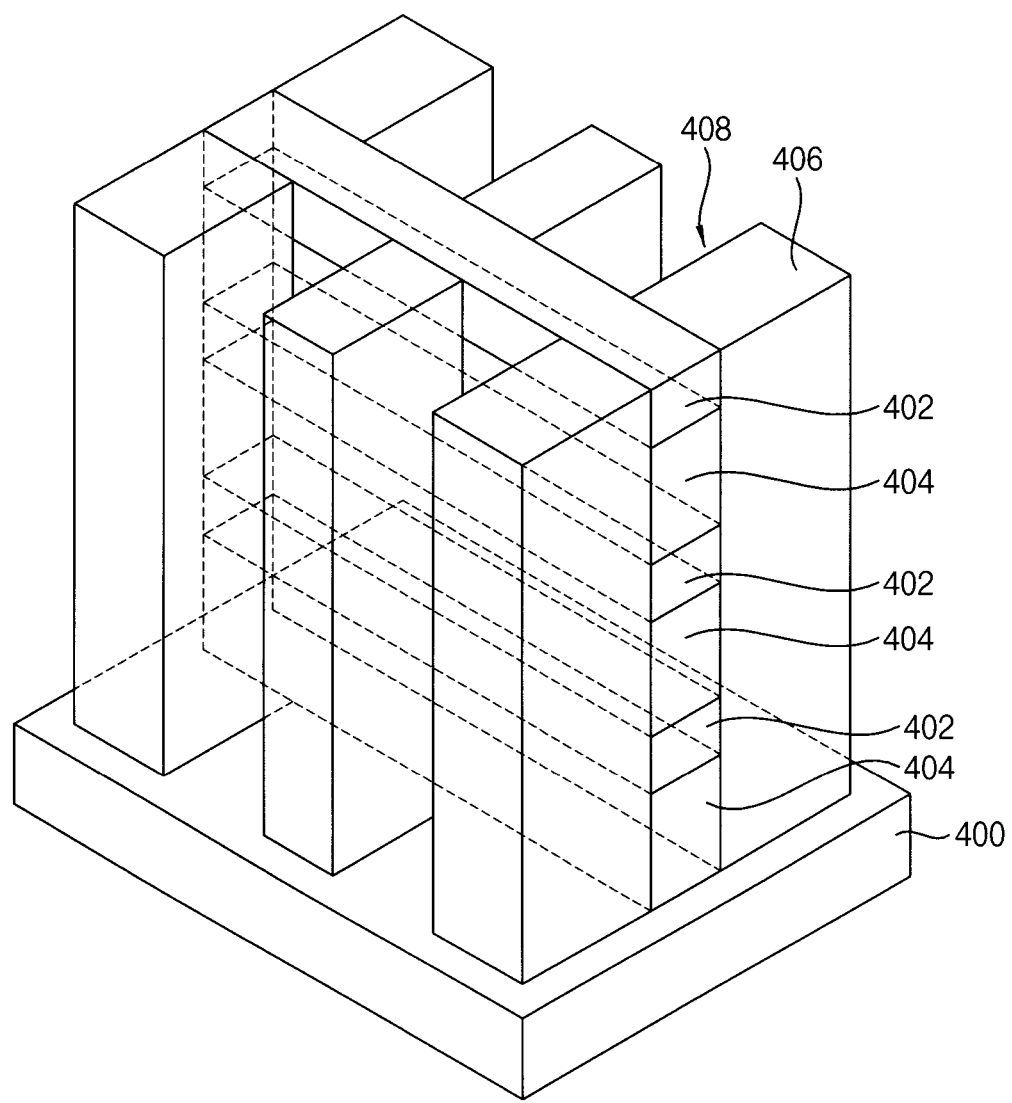

FIGS. 13A and 13B are perspective views showing a method of fabricating the vertical gate type non-volatile memory device of FIG. 12A.

Referring to FIG. 13A, a structure that stacks the channel patterns 402 and the first insulating interlayer patterns 404 may be formed on a substrate 100. The structure has the shape of a line extending in the first direction.

In some example embodiments, the structure may be formed by sequentially forming channel layers and first insulating interlayers and then patterning the channel layers and the first insulating interlayers. In another example embodiment, the structure may be formed by sequentially forming channel layers including a semiconductor material and sacrificial layers, forming a recess parts by removing the sacrificial layers, and filling first insulating interlayer patterns in the recess parts.

A second insulating interlayer 405 is filled in a gap between structures described above.

Referring to FIG. 13B, second insulating interlayer patterns 406 are formed in the shape of a pillar while protruding in a lateral direction of the structure by etching a portion of the second insulating interlayer 405. The opening 408 is formed between the second insulating interlayer patterns 406. The sidewalls of the channel patterns 402 and the first insulating interlayer patterns are exposed in the openings.

Referring to FIG. 12A again, the tunnel oxide layer 410, the charge trap layer 412, and the blocking dielectric layer 414 are formed on the sidewall of the opening 408 and exposed the channel pattern 402 in the opening 408. The blocking dielectric layer 414 may include a material having a dielectric constant of at least 3.9. The blocking dielectric layer 414 may include metallic oxide. When the blocking dielectric layer 414 has a multi-layer structure, a blocking dielectric layer making direct contact with the word line has a dielectric constant greater than those of the blocking dielectric layers formed at other layers.

Thereafter, a word line 416 is fully filled in the opening 408 while making contact with the blocking dielectric layer 414.

Embodiment 9

Figure 14A:
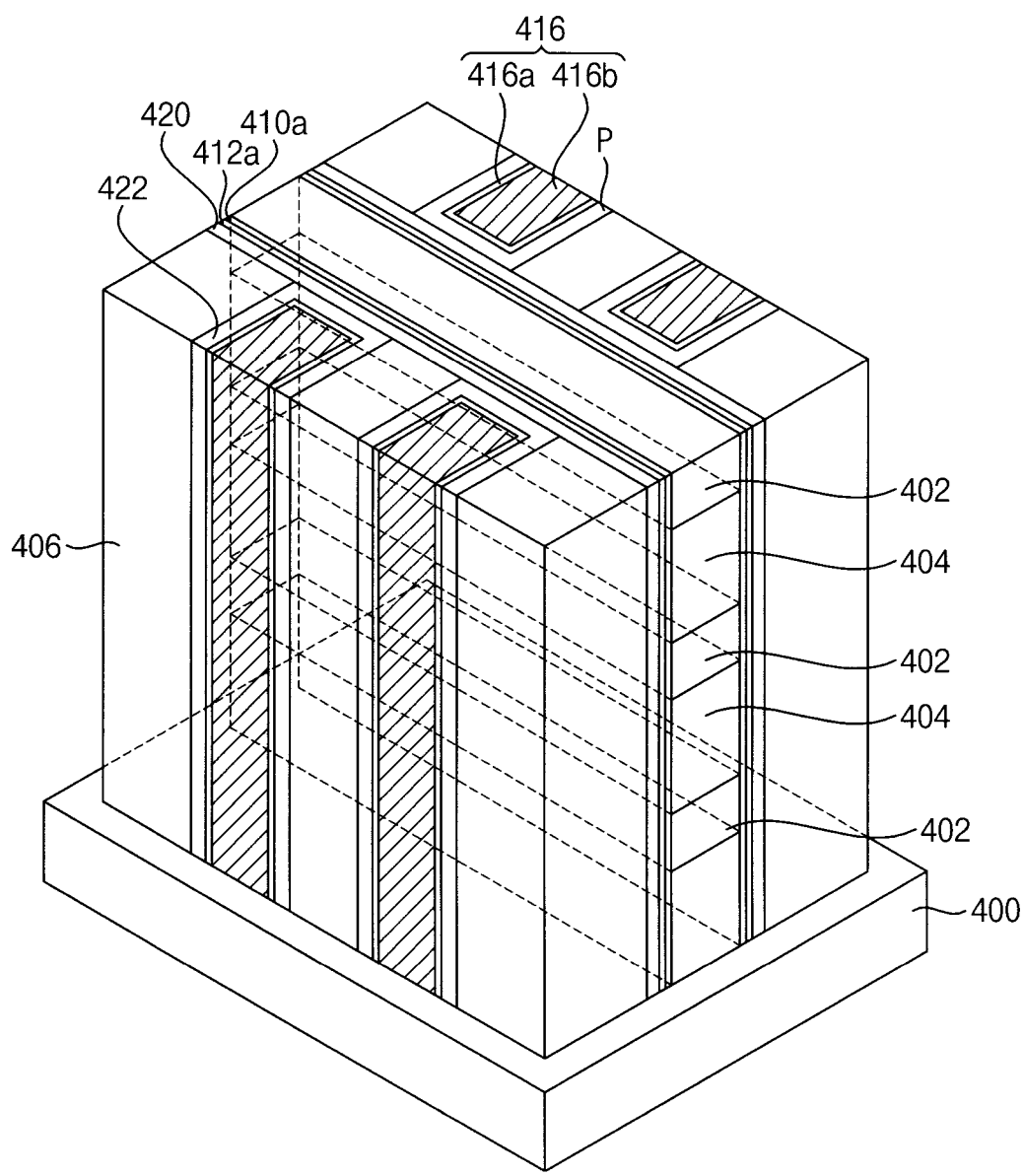
FIG. 14A is a perspective view showing a part of a vertical gate type non-volatile memory device according to one example embodiment.
Figure 14B:
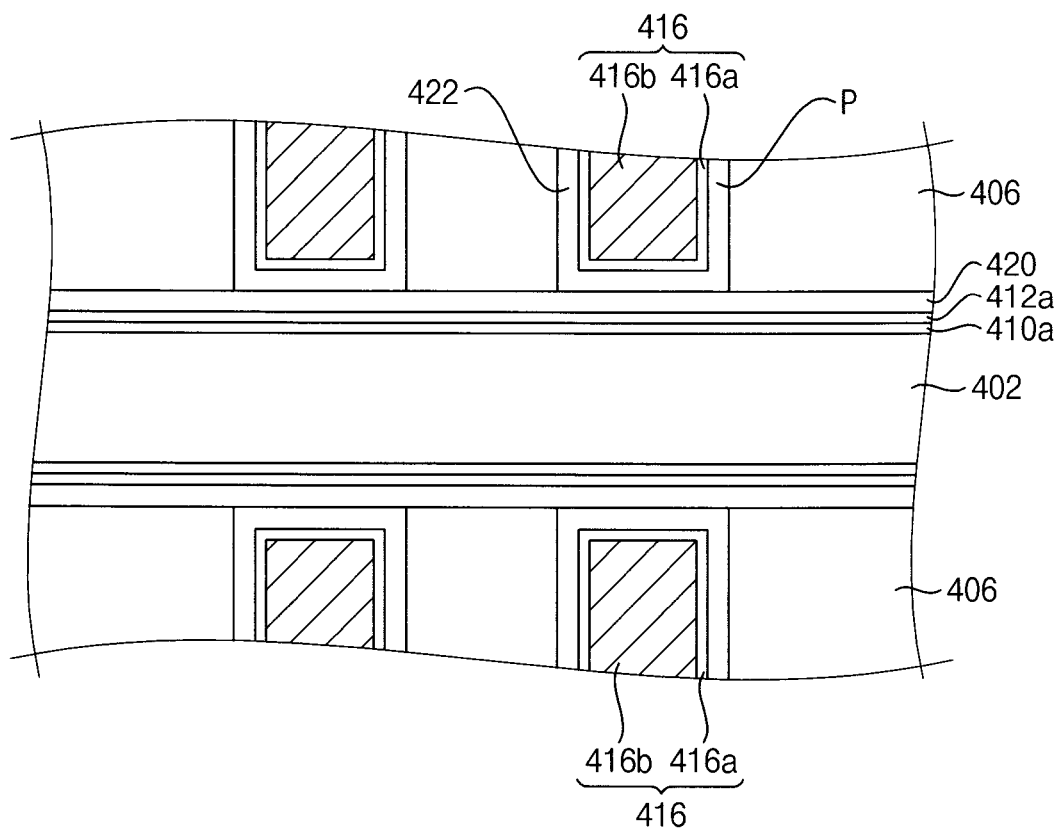
FIG. 14B is a plan view of FIG. 14A.

FIG. 14A is a perspective view showing a part of a vertical gate type non-volatile memory device according to another example embodiment, and FIG. 14B is a plan view of FIG. 14A.

Referring to FIGS. 14A and 14B, the vertical gate type non-volatile memory device may include the channel patterns 402 having a multi-layer structure and word lines 416 having a shape of pillars which are formed on the substrate 400 while facing the sidewalls of the channel patterns 402.

The channel patterns 402 have the shape of a line extending in the first direction. The channel patterns 402 are stacked in a multi-layer structure while interposing the first insulating interlayer pattern 404 there between. In other words, first insulating interlayer patterns 404 and the channel patterns 402 may be repeatedly and alternately stacked on the substrate.

A tunnel oxide layer 410a, a charge trap layer 412a, and a first blocking dielectric layer 420 are provided in such a manner that the tunnel oxide layer 410a, the charge trap layer 412a, and the first blocking dielectric layer 420 make direct contact with the sidewall of the structure in which the channel pattern 402 and the first insulating interlayer pattern 404 are stacked. The first blocking dielectric layer 420 may include a plurality of dielectric layers.

The second insulating interlayer patterns 406 having the shape of a pillar are formed at the lateral side of the first blocking dielectric layer 420. Openings 408 are defined between the second insulating interlayer patterns 406 to expose both sidewalls of the channel patterns 402

The second blocking dielectric layer 422 is formed on the sidewall of the opening 408 and exposed the first blocking dielectric layer in the opening 408. The second blocking dielectric layer 422 has a dielectric constant greater than those of the dielectric layers constituting the first blocking dielectric layer 420. The second blocking dielectric layer 422 includes a first part making contact with the sidewall of the channel pattern 402 and a second part protruding from the sidewall of the channel pattern 402 on the end point of the first part.

The word lines 416 extend perpendicularly to the substrate 400 while making contact with the second blocking dielectric layer 422. In other words, the word lines 416 have a shape of a pillar. The word lines 416 may have the same structure as those described with reference to FIGS. 13a and 13b.

The second blocking dielectric layer 422 includes a material having a dielectric constant of at least 3.9. The second blocking dielectric layer 422 may include metallic oxide.

The word line 416 is surrounded by the second blocking dielectric layer 422. A portion P of the blocking dielectric layer 422 protruding in a lateral direction of the channel pattern 402 serves as the second spacer provided with a high dielectric constant according to the first example embodiment. Accordingly, the back tunneling caused by the concentration of the electric field on the bending portion of the edge region of the word line 416 is reduced, so that the non-volatile memory device according to example embodiments have improved erasing operation characteristics.

Figure 15A:
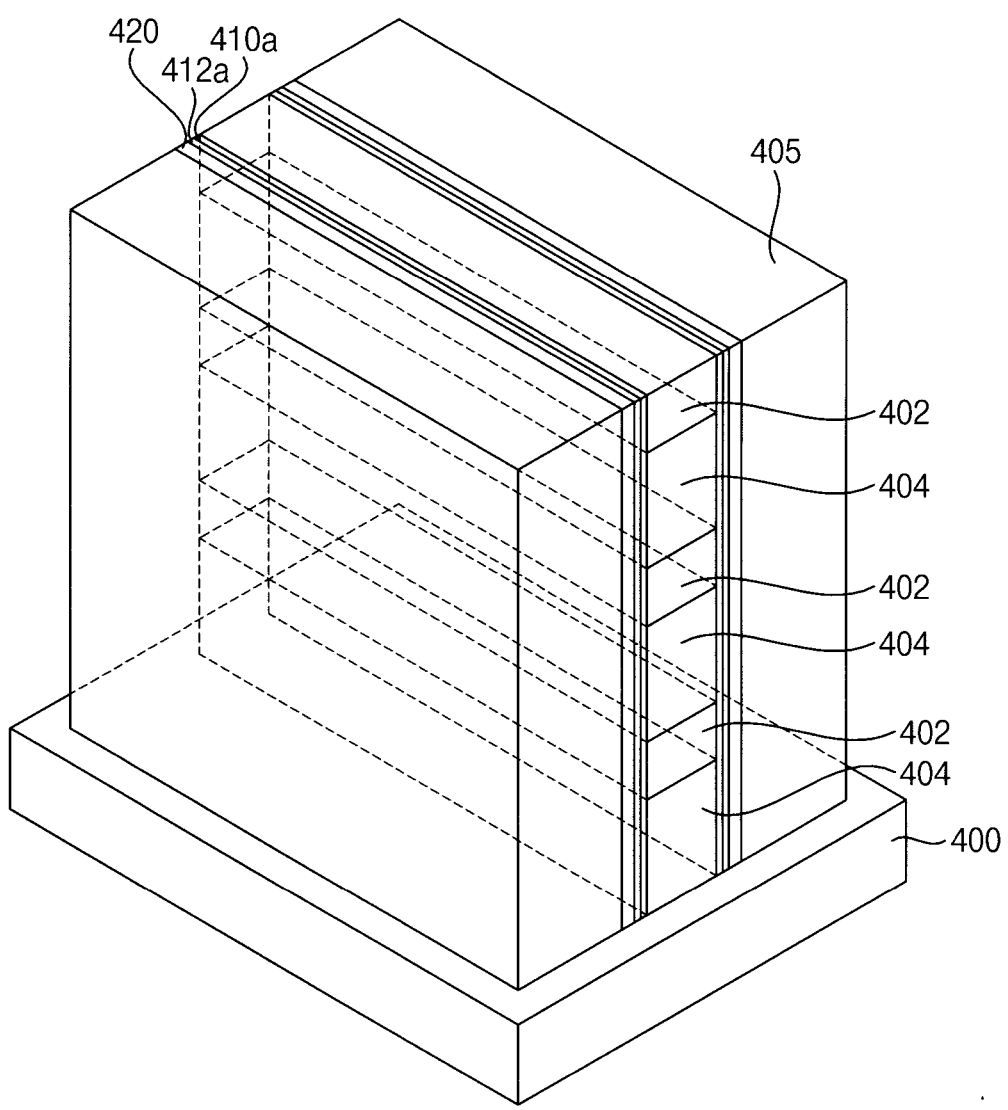
FIGS. 15A and 15B are perspective views showing a method of fabricating the vertical gate type non-volatile memory device of FIG. 14A.
Figure 15B:
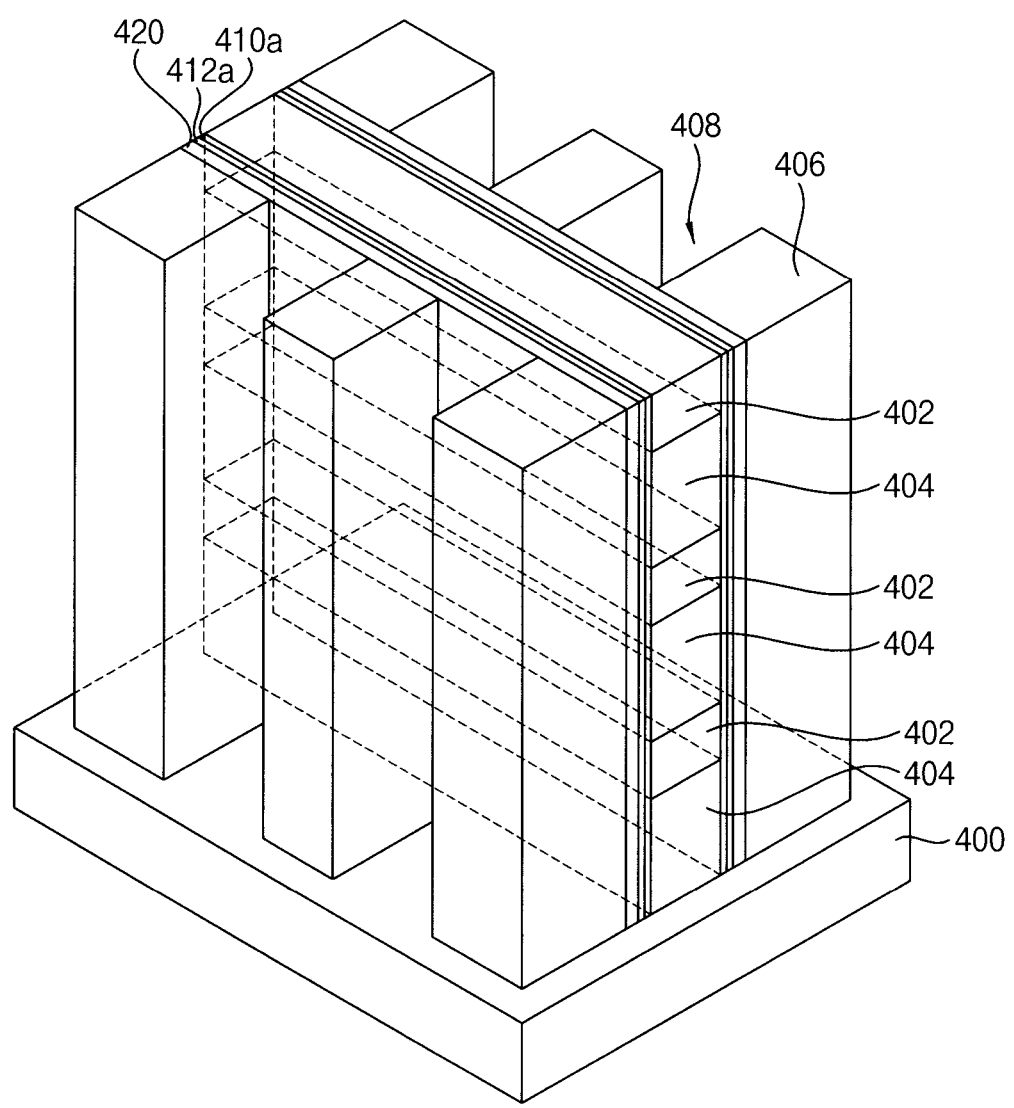

FIGS. 15A and 15B are perspective views showing a method of fabricating the vertical gate type non-volatile memory device of FIG. 14A.

Referring to FIG. 15A, a structure that stacks the channel patterns 402 and the first insulating interlayer patterns 404 may be formed on a substrate 100. The structure has the shape of a line extending in the first direction. The structure may be formed in the same manner as that described with reference to FIG. 13A.

The tunnel oxide layer 410a, the charge trap layer 412a, and the first blocking dielectric layer 420 are sequentially formed to cover both sidewalls of the structure. The first blocking dielectric layer 420 may include a plurality of dielectric layers.

The second insulating interlayer 405 is fully filled in the gap between the structures.

Referring to FIG. 15B, the second insulating interlayer patterns 406 having the shape of pillars are formed protruding in a lateral direction of the structure by etching a portion of the second insulating interlayer 405. The opening 408 between the second insulating interlayer patterns 406 may be formed. The first blocking dielectric layer 420 may be exposed in the opening 408.

Referring to FIG. 14A again, the second blocking dielectric layer 422 is formed on the sidewall of the opening 408 and exposed the first blocking dielectric layer in the opening 408. The second blocking dielectric layer 422 has a dielectric constant greater than those of the dielectric layers constituting the first blocking dielectric layer 420. The second blocking dielectric layer 422 includes the first part making contact with the sidewall of the channel pattern 402 and the second part protruding from the sidewall of the channel pattern 402 on the end point of the first part.

Thereafter, the word line 416 is fully filled in the opening 408 while making contact with the second blocking dielectric layer 422.

Embodiment 10

Figure 16A:
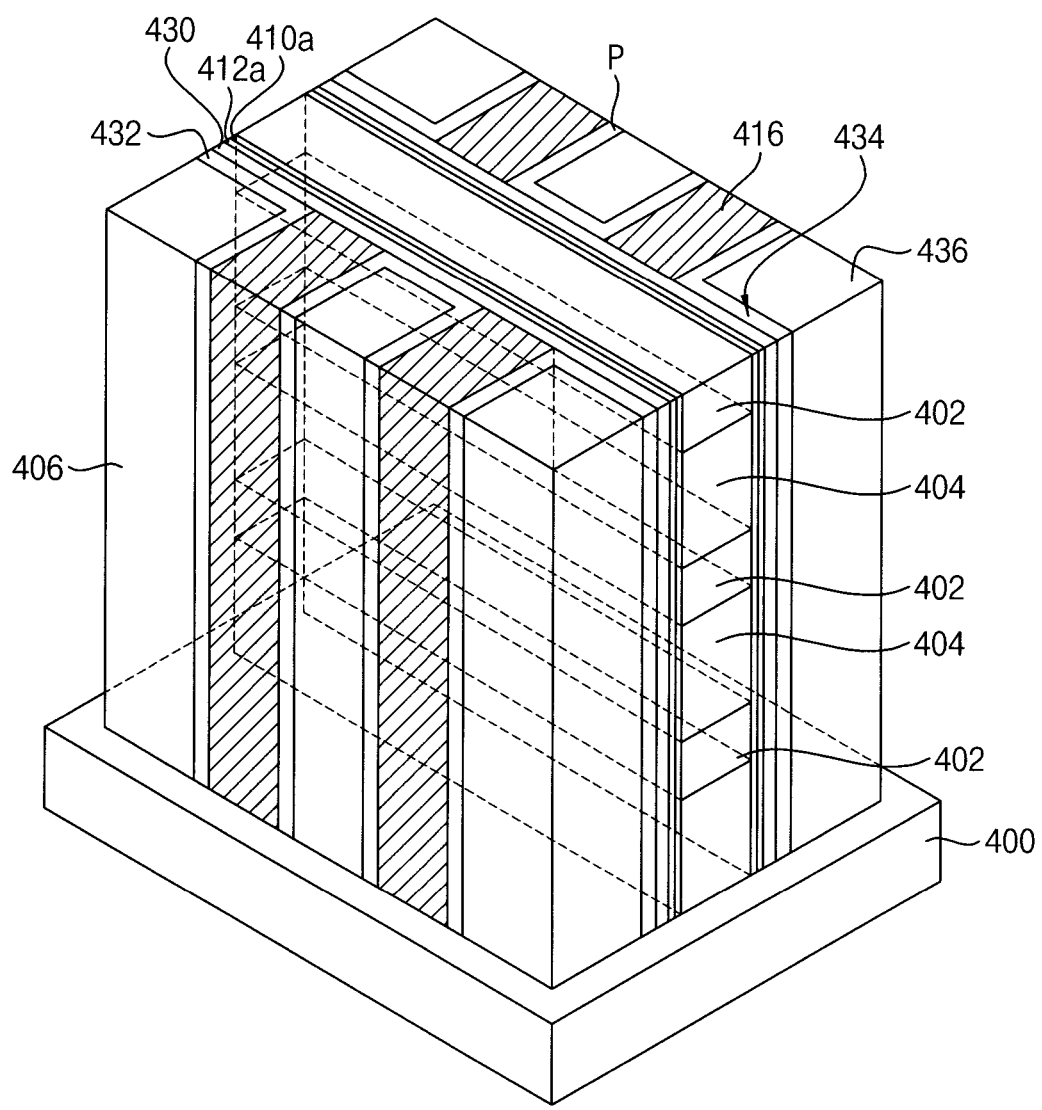
FIG. 16A is a perspective view showing a part of a vertical gate type non-volatile memory device according to another example embodiment.
Figure 16B:
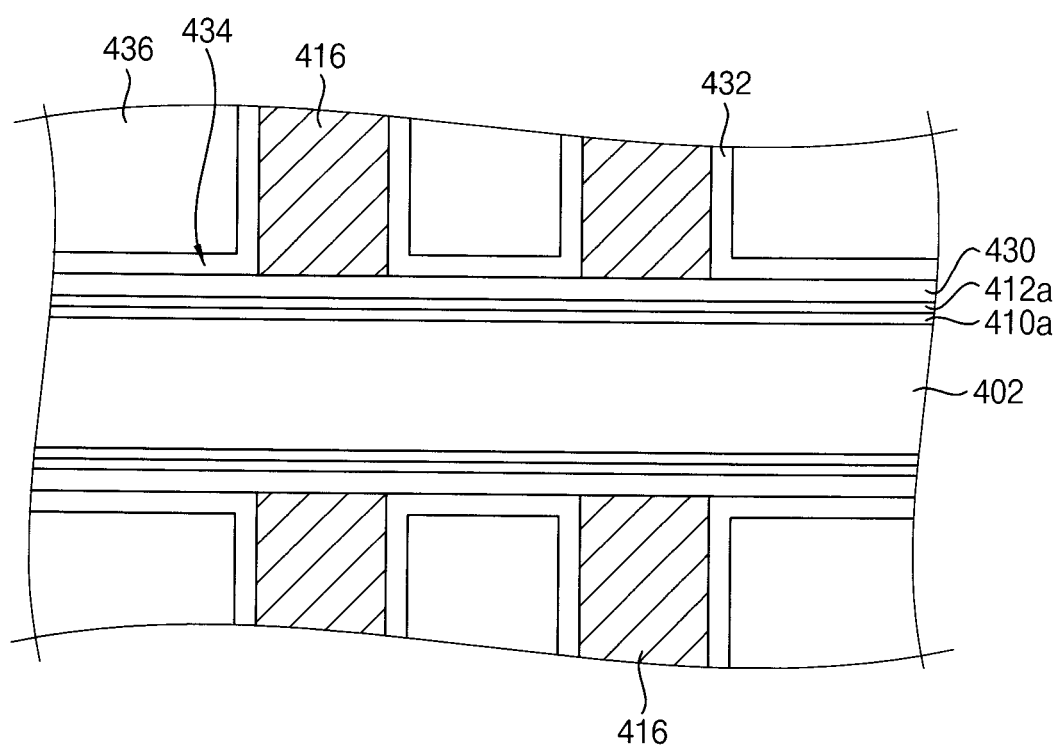
FIG. 16B is a plan view of FIG. 16A.

FIG. 16A is a perspective view showing a part of a vertical gate type non-volatile memory device according to another example embodiment. FIG. 16B is a plan view of FIG. 16A.

Referring to FIGS. 16A and 16B, the vertical gate type non-volatile memory device may include the channel patterns 402 having a multi-layer structure and word lines 416 having the shape of a pillar which are formed on the substrate 400 while facing the sidewalls of the channel patterns 402.

The channel patterns 402 have the shape of a line extending in the first direction. The channel patterns 402 are stacked in a multi-layer structure while interposing the first insulating interlayer pattern 404 there between. In other words, the first insulating interlayer patterns 404 and the channel patterns 402 may be repeatedly and alternately stacked on the substrate.

The tunnel oxide layer 410a, the charge trap layer 412a, and a first blocking dielectric layer 430 may be sequentially stacked. The tunnel oxide layer 410a may make direct contact with the sidewall of the structure in which the channel pattern 402 and the first insulating interlayer pattern 404 are stacked. The first blocking dielectric layer 430 may include a plurality of dielectric layers.

The blocking dielectric layer 430 includes a material having a dielectric constant of at least 3.9. The blocking dielectric layer 430 may include metallic oxide. If the blocking dielectric layer 430 has a multi-layer structure, the blocking dielectric layer 430 making direct contact with the word line has a dielectric constant greater than those of the blocking dielectric layers formed at other layers.

The word lines 416 have the shape of a pillar on the substrate 400 while making contact with the blocking dielectric layer 430. The word lines 416 extend in the first direction while being provided in parallel to each other. The word lines 416 may include a metallic material.

Openings 424 are defined between the word lines 416 to expose the blocking dielectric layer 420.

A high dielectric layer pattern 432 is formed on the sidewall of the opening 434 and exposed the blocking dielectric layer 430 in the opening 434. The high dielectric layer pattern 432 is formed on the sidewalls of the word lines 416 and the top surface of the blocking dielectric layer 430 between word lines 416.

The high dielectric layer pattern 432 has a dielectric constant equal to or greater than that of a dielectric layer making direct contact with the word line among dielectric layers constituting the blocking dielectric layer 430. The high dielectric layer pattern 432 may include a material the same as that of a dielectric layer constituting the blocking dielectric layer 430. Alternately, the high dielectric layer pattern 432 may include a material different from that of the dielectric layer constituting the blocking dielectric layer 430.

A second insulating interlayer pattern 436 is formed on the high dielectric layer pattern 432 so that the second insulating interlayer pattern 436 is filled in a gap between the word lines.

The high dielectric layer pattern 432 covers the sidewall of the word line 416. Accordingly, the high dielectric layer pattern 432 serves as the second spacer provided with a high dielectric constant according to the first example embodiment. Accordingly, the back tunneling caused by the concentration of the electric field at the bending portion of the edge region of the word line 416 is reduced, so that the non-volatile memory device according to example embodiments have improved erasing operation characteristics.

Figure 17A:
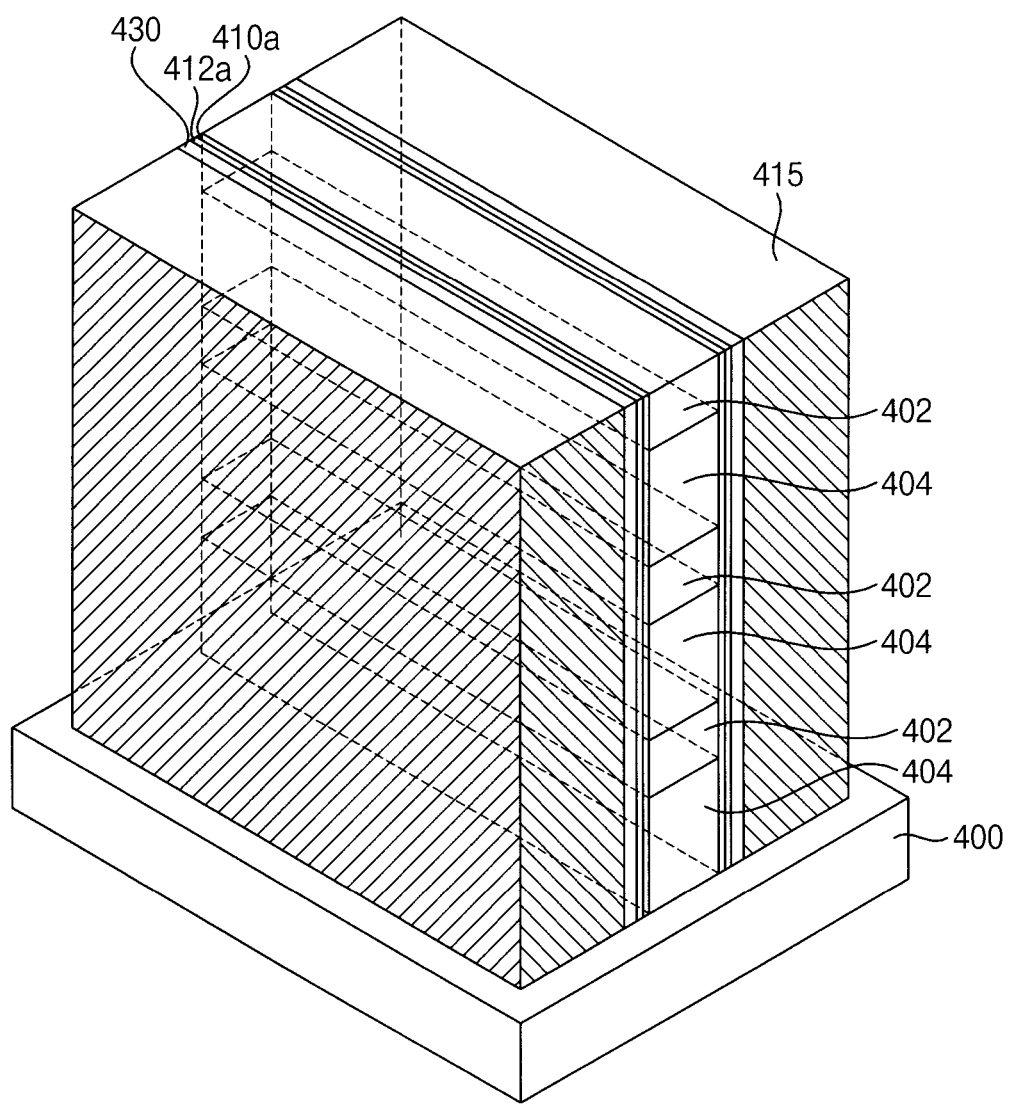
FIGS. 17A to 17C are perspective views showing a method of fabricating the vertical gate type non-volatile memory device of FIG. 16A.
Figure 17B:
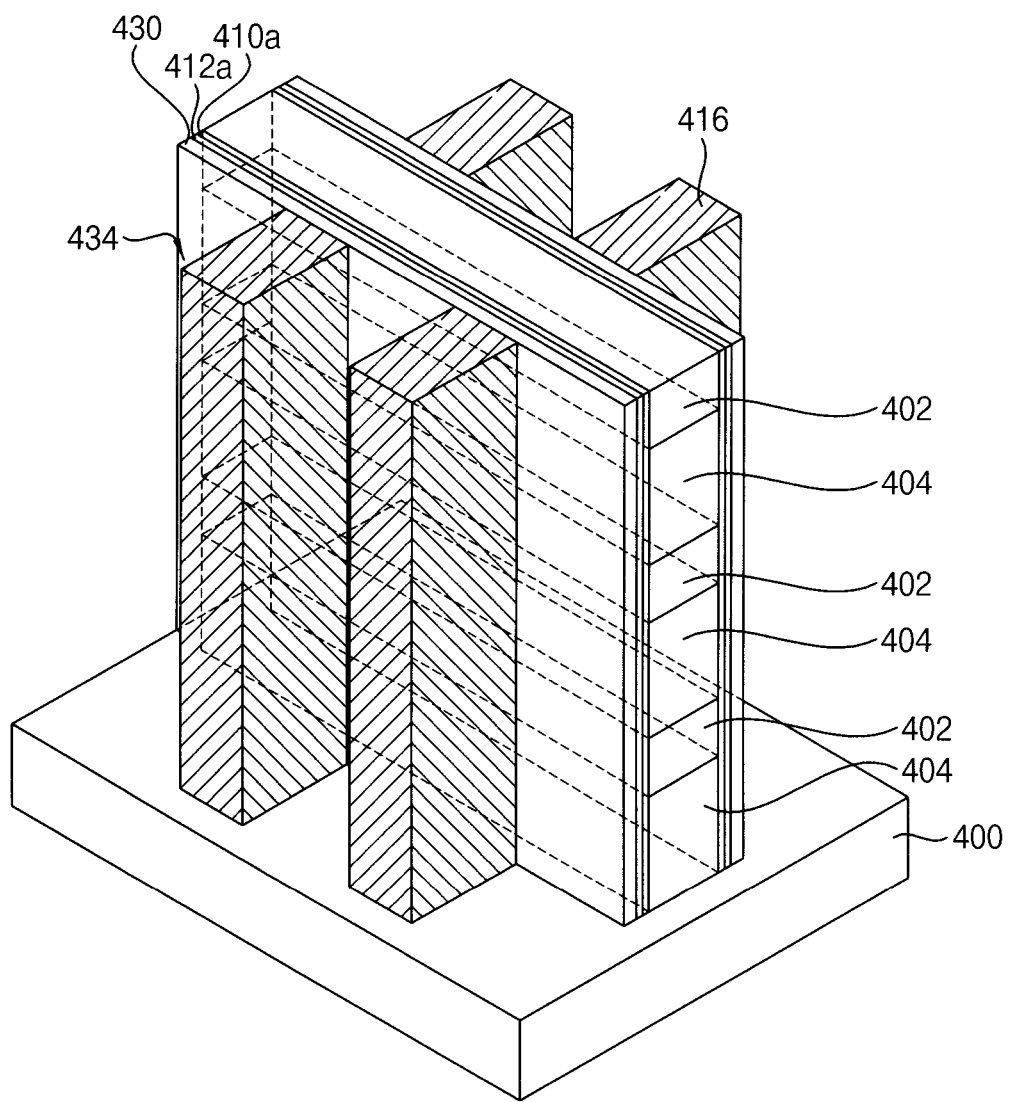
Figure 17C:
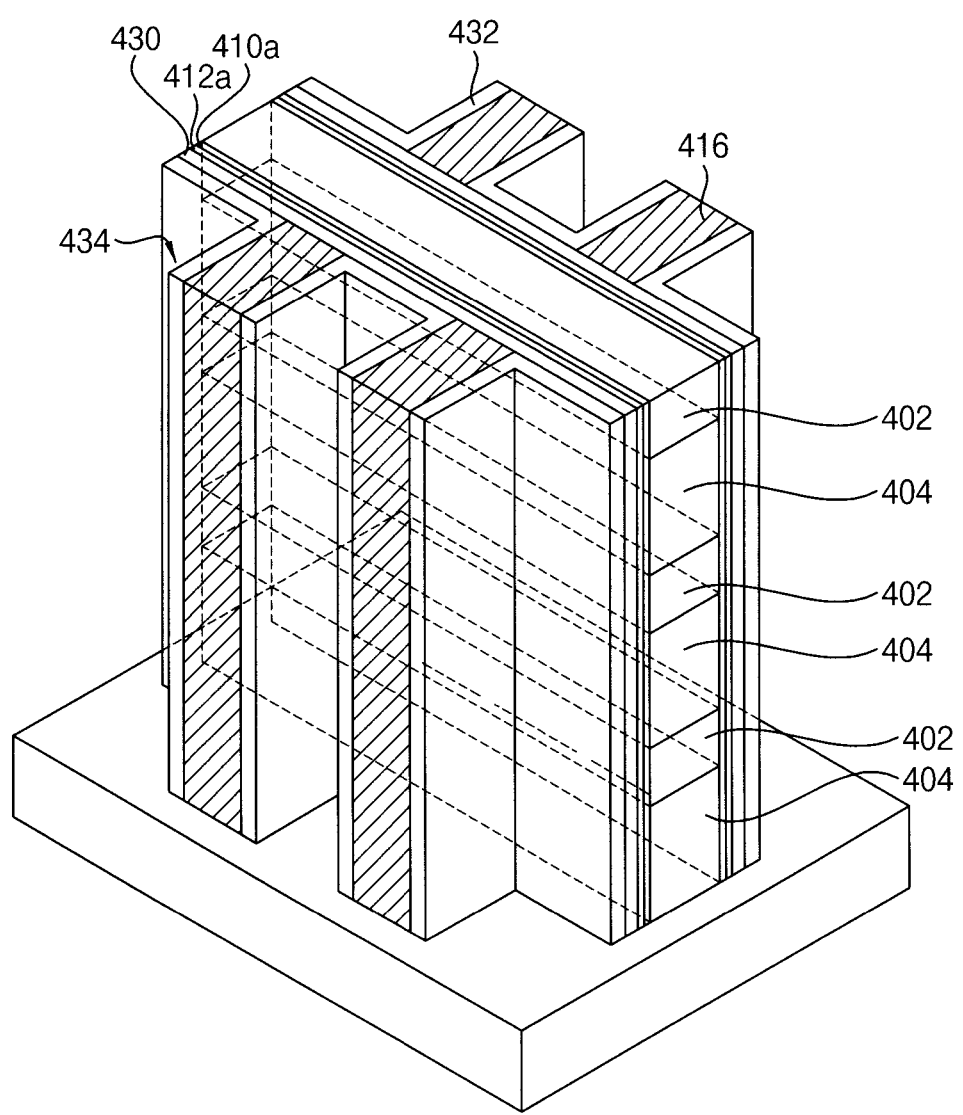

FIGS. 17A to 17C are perspective views showing a method of fabricating the vertical gate type non-volatile memory device of FIG. 16a.

Referring to FIG. 17A, the structure stacked the channel patterns 402 and the first insulating interlayer patterns 404 may be formed on a substrate 100. The structure has the shape of a line extending in the first direction. The structure may be formed in the same manner as that described with reference to FIG. 13A.

The tunnel oxide layer 410a, the charge trap layer 412a, and the blocking dielectric layer 430 are sequentially formed to cover both sidewalls of the structure. The blocking dielectric layer 430 may include a plurality of dielectric layers.

The blocking dielectric layer 430 includes a material having a dielectric constant of at least 3.9. The blocking dielectric layer 430 may include metallic oxide. If the blocking dielectric layer 430 has a multi-layer structure, the blocking dielectric layer 430 making direct contact with the word line has a dielectric constant greater than those of the blocking dielectric layers formed at other layers.

A conductive layer 415 is formed on the blocking dielectric layer 430 so that the conductive layer 415 is fully filled in the gap between structures described above. The conductive layer 415 is used to form a word line. The conductive layer 415 may include a metallic material.

Referring to FIG. 17B, the word lines 416 are formed in the shape of pillars while protruding in a lateral direction of the structure by etching a portion of the conductive layer 415. An opening 434 is defined between the word lines 416. The blocking dielectric layer 430 may be exposed in the opening 434.

Referring to FIG. 17C, the high dielectric layer pattern 432 is formed on the sidewall of the opening 434 and exposed the first blocking dielectric layer in the opening 434.

The high dielectric layer pattern 432 has a dielectric constant equal to or greater than that of a dielectric layer making direct contact with the word line among dielectric layers constituting the blocking dielectric layer 430. The high dielectric layer pattern 432 may include a material the same as that of a dielectric layer constituting the blocking dielectric layer 430. In addition, the high dielectric layer pattern 432 may include a material different from that of the dielectric layer constituting the blocking dielectric layer 430.

Referring to FIG. 16A again, the second insulating interlayer pattern 436 is formed on the high dielectric layer patterns so that the second insulating interlayer pattern 436 is fully filled in the opening 434.

Embodiment 11

Figure 18A:
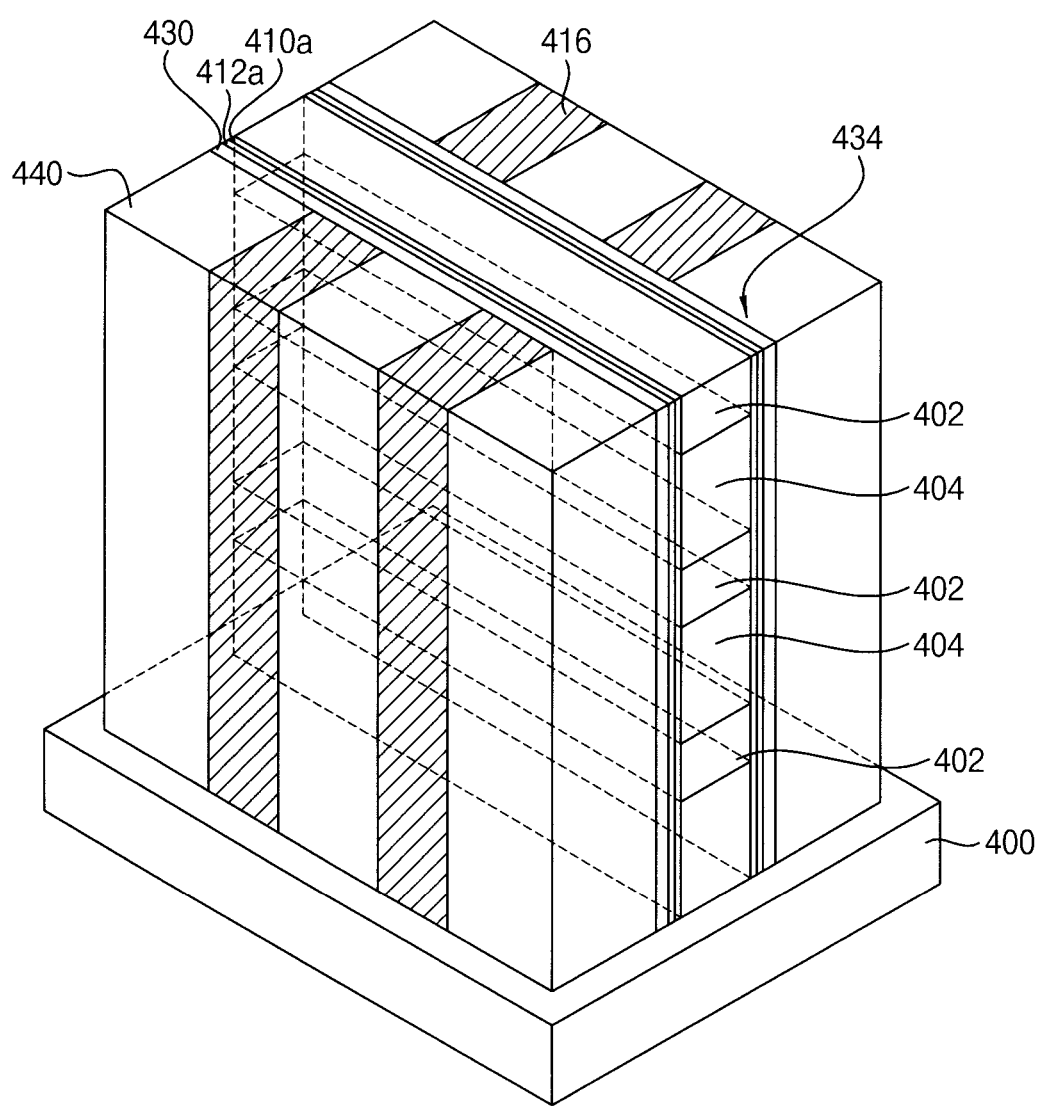
FIG. 18A is a perspective view showing a part of a vertical gate type non-volatile memory device according to another example embodiment.
Figure 18B:
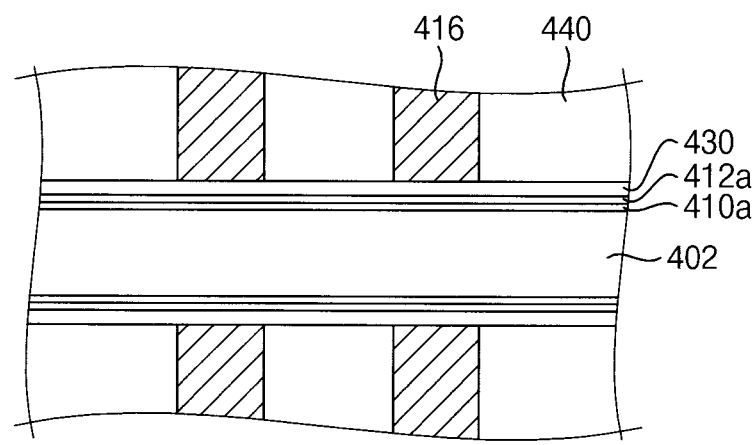
FIG. 18B is a plan view of FIG. 18A.

FIG. 18A is a perspective view showing a part of a vertical gate type non-volatile memory device according to another example embodiment. FIG. 18B is a plan view of FIG. 18a.

Referring to FIGS. 18A and 18B, the vertical gate type non-volatile memory device may include the channel patterns 402 having a multi-layer structure and the word lines 416 having the shape of a pillar on the substrate 400 while facing the sidewalls of the channel patterns 402.

The channel patterns 402 have the shape of a line extending in the first direction. The channel patterns 402 are stacked in a multi-layer structure while interposing the first insulating interlayer pattern 404 there between. In other words, the first insulating interlayer patterns 404 and the channel patterns 402 may be repeatedly and alternately stacked on the substrate.

The tunnel oxide layer 410a, the charge trap layer 412a, and a first blocking dielectric layer 430 may be sequentially stacked. The tunnel oxide layer 410a may make direct contact with the sidewall of the structure in which the channel pattern 402 and the first insulating interlayer pattern 404 are stacked. The blocking dielectric layer 430 may include a plurality of dielectric layers.

The blocking dielectric layer 430 includes a material having a dielectric constant of at least 3.9. The blocking dielectric layer 430 may include metallic oxide. If the blocking dielectric layer 430 has a multi-layer structure, the blocking dielectric layer 430 making direct contact with the word line has a dielectric constant greater than those of the blocking dielectric layers formed at other layers.

The word lines 416 having the shape of a pillar on substrate 400 make contact with the blocking dielectric layer 430. In other words, the word lines 416 are formed in the first direction in parallel to each other. The word lines 416 include a metallic material.

Openings 434 are defined between the word lines 416 to expose both sidewalls of the blocking dielectric layer 430.

The high dielectric layer pattern 440 is provided in such a manner that the high dielectric layer pattern 440 is fully filled in the opening 434. The high dielectric layer pattern 440 may have the shape of a pillar making contact with the blocking dielectric layer 430 and the sidewall of the word line 416.

The high dielectric layer pattern 440 has a dielectric constant equal to or greater than that of a dielectric layer making direct contact with the word line among dielectric layers constituting the blocking dielectric layer 430. The high dielectric layer pattern 440 may include a material the same as that of a dielectric layer constituting the blocking dielectric layer 430. In addition, the high dielectric layer pattern 440 may include a material different from that of the dielectric layer constituting the blocking dielectric layer 430.

The high dielectric layer pattern 440 covers the sidewall of the word line 416. Accordingly, the high dielectric layer pattern 440 serves as the second spacer provided with a high dielectric constant according to the first example embodiment. Accordingly, the back tunneling caused by the concentration of the electric field at the bending portion of the edge region of the word line 416 is reduced, so that the non-volatile memory device according to example embodiments has improved erasing operation characteristics.

The vertical gate type non-volatile memory device illustrated in FIG. 18A may be formed in the same manner as that described with reference to FIGS. 17A and 17B.

First, the structure illustrated in FIG. 17B is formed by performing the processes the same as those described with reference to FIGS. 17A and 17B.

Next, as illustrated in FIG. 18A, the high dielectric layer pattern 440 is formed on the blocking dielectric layer while being fully filled in the opening. Accordingly, the high dielectric layer pattern 440 has the shape of pillars.

The high dielectric layer pattern 440 has a dielectric constant equal to or greater than that of a dielectric layer making direct contact with the word line among dielectric layers constituting the blocking dielectric layer 430. The high dielectric layer pattern 440 may include a material the same as that of a dielectric layer constituting the blocking dielectric layer 430. Alternately, the high dielectric layer pattern 440 may include a material different from that of the dielectric layer constituting the blocking dielectric layer 430.

Figure 19:
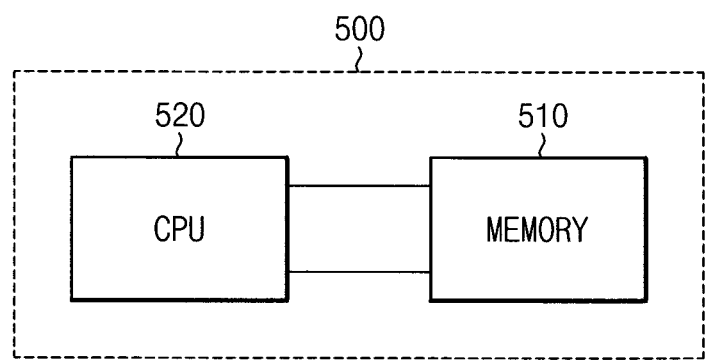

FIG. 19 is a block diagram illustrating a memory system provided with the non-volatile memory device according to one of the example embodiments.

Referring to FIG. 19, a non-volatile memory device 510 is electrically connected to a central processing unit (CPU) 520 provided in a memory system 500 such as a computer. The memory system 500 may include a personal computer (PC), a personal data assistant (PDA), and the like. The non-volatile memory device 510 may be directly connected with the CPU 520 or may be connected with the CPU 520 through a bus. The non-volatile memory device 510 has a gate structure according to the various example embodiments. Accordingly, the non-volatile memory device 510 has improved erase saturation characteristics and improved reliability. Since the non-volatile memory device 510 is applied to the memory system 500, the performance of the memory system 500 can be improved.

As described above, the non-volatile memory device including the gate structure according to the example embodiments that have improved erase saturation characteristics and superior reliability. The non-volatile memory device is applicable to various memory systems and various electronic products.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A gate structure comprising:
   a tunnel oxide layer pattern and a charge trap layer pattern sequentially stacked on a substrate;
   a blocking dielectric layer pattern formed on the charge trap layer pattern, the blocking dielectric layer having an uppermost layer including a material having a first dielectric constant that is greater than that of a material included in the tunnel oxide layer pattern;
   first and second conductive layer patterns sequentially stacked on the blocking dielectric layer pattern;
   a first spacer covering at least a sidewall of the second conductive layer pattern; and
   a second spacer covering sidewalls of the first spacer and the first conductive layer pattern and including a material having a second dielectric constant, the second dielectric constant equal to or greater than the first dielectric constant.

2. The gate structure of claim 1, wherein the first conductive layer pattern includes a first metallic material and the second conductive layer pattern includes a second metallic material that is different from the first metallic material.

3. The gate structure of claim 1, wherein the first conductive layer pattern has a first work function and the second conductive layer pattern has a second work function that is less than the first work function.

4. The gate structure of claim 1, wherein the sidewall of the first conductive layer pattern includes a lower portion and an upper portion, the lower portion having a lower sidewall protruding in a lateral direction such that the lower portion has a first width, and the upper portion has a second width narrower than the first width.

5. The gate structure of claim 1, wherein a bottom surface of the first spacer is spaced apart from and above a top surface of the blocking dielectric layer pattern by a thin film.

6. The gate structure of claim 1, wherein a bottom surface of the second spacer is closer to the substrate than a bottom surface of the first spacer.

7. The gate structure of claim 1, wherein the uppermost layer of the blocking dielectric layer pattern includes any one of material selected from the group consisting of aluminum oxide ($Al_2O_3$), hafnium oxide ($HfO_2$), lanthanum oxide ($La_2O_3$), lanthanum aluminum oxide ($LaAlO_3$), lanthanum hafnium oxide (LaHfO), hafnium aluminum oxide (HfAlO), titanium oxide ($TiO_2$), tantalum oxide ($Ta_2O_5$), and zirconium oxide ($ZrO_2$).

8. The gate structure of claim 1, wherein the first spacer covers the sidewall of the second conductive layer pattern and an upper sidewall of the first conductive layer pattern.

9. The gate structure of claim 1, further comprising:
   a buffer conductive layer pattern between the first and second conductive layer patterns.

10. The gate structure of claim 9, wherein the buffer conductive layer pattern includes a polysilicon material.

11. The gate structure of claim 9, wherein the first spacer covers the sidewall of the second conductive layer pattern and a portion of a sidewall of the buffer conductive layer pattern.

12. The gate structure of claim 1, wherein the second spacer has an upper portion and a lower portion, the lower portion being a portion of the second spacer that contacts the first conductive layer pattern, the lower portion having a width wider than a width of the upper portion.

13. A gate structure comprising:
- a tunnel oxide layer pattern and a charge trap layer pattern sequentially stacked on a substrate;
- a blocking dielectric layer pattern formed on the charge trap layer pattern and including at least one dielectric layer;
- a barrier metallic layer pattern formed on the blocking dielectric layer pattern;
- a metallic layer pattern on the barrier metallic layer pattern;
- a first spacer covering a sidewall of the metallic layer pattern and an upper sidewall of the barrier metallic layer pattern; and
- a second spacer covering a sidewall of the first spacer and a lower sidewall of the barrier metallic layer pattern and including a material having a first dielectric constant equal to or greater than a second dielectric constant of an uppermost dielectric layer of the blocking dielectric layer pattern.

14. The gate structure of claim 13, wherein a bottom surface of the second spacer is in direct contact with a top surface of the blocking dielectric layer pattern.

15. The gate structure of claim 13, wherein the first spacer includes an insulating material configured to suppress oxidization of the sidewall of the metallic layer pattern.

16. A gate structure comprising:
- a substrate having sequentially formed thereon a tunnel oxide layer pattern and a charge trap layer pattern, the charge trap layer pattern configured to trap charges therein and the tunnel oxide layer pattern including a material having a first dielectric constant;
- a blocking dielectric layer formed on the charge trap layer pattern, the blocking dielectric layer having a top surface that includes an inner portion and an outer portion, the inner portion of the top surface including a material having a second dielectric constant, the second dielectric constant being greater than the first dielectric constant;
- a first conductive layer pattern formed on the inner portion of the blocking dielectric layer, the first conductive layer pattern having sidewalls;
- a second conductive layer pattern formed on the first conductive layer pattern, the second conductive layer pattern including a metallic material having a resistance lower than that of a material included in the first conductive layer pattern;
- a first spacer including a material having a third dielectric constant, the first spacer enclosing the second conductive layer to prevent oxidation thereof; and
- a second spacer formed on the outer portion of the blocking dielectric layer such that the spacer covers the sidewalls of the first conductive layer pattern, the second spacer having a fourth dielectric constant, the fourth dielectric constant being greater than or equal to the second dielectric constant and greater than the third dielectric constant.

17. The gate structure of claim 16, wherein the first conductive layer pattern has a top surface that includes an inner conductive portion and an outer conductive portion, the inner conductive portion being in contact with the second conductive layer pattern and the outer conductive portion being in contact with a bottom surface of the first spacer.

18. The gate structure of claim 17, wherein a bottom surface of the second spacer is closer to the substrate than the bottom surface of the first spacer.

19. The gate structure of claim 18, wherein the bottom surface of the second spacer is wider than a top surface of the second spacer.

20. The gate structure of claim 16, further comprising:
- a buffer conductive layer pattern formed between the first conductive layer pattern and the second conductive layer pattern, the buffer conductive layer having a top surface that includes an inner buffer portion and an outer buffer portion, wherein
  - the inner buffer portion is in contact with the second conductive layer pattern and the outer conductive portion is in contact with a bottom surface of the first spacer, and
- the buffer conductive layer pattern has a thickness that is greater than a thickness of the first conductive layer pattern.

* * * * *